US012696432B2

(12) United States Patent
Lei et al.

(10) Patent No.: US 12,696,432 B2
(45) Date of Patent: Jul. 28, 2026

(54) ENERGY-SAVING METHOD APPLIED TO MACHINE ROOM, APPARATUS, AND SYSTEM

(71) Applicant: HUAWEI TECHNOLOGIES CO., LTD., Shenzhen (CN)

(72) Inventors: Gaowei Lei, Xi'an (CN); Juan Chen, Shanghai (CN); Danjun Yang, Xi'an (CN); Lei Shi, Shenzhen (CN)

(73) Assignee: Huawei Technologies Co., LTD., Shenzhen (CN)

( * ) Notice: Subject to any disclaimer, the term of this patent is extended or adjusted under 35 U.S.C. 154(b) by 441 days.

(21) Appl. No.: 18/472,789

(22) Filed: Sep. 22, 2023

(65) Prior Publication Data

US 2024/0023296 A1    Jan. 18, 2024

Related U.S. Application Data

(63) Continuation of application No. PCT/CN2022/082480, filed on Mar. 23, 2022.

(30) Foreign Application Priority Data

Mar. 25, 2021    (CN) .......................... 202110321118.4

(51) Int. Cl.
*H05K 7/20* (2006.01)
(52) U.S. Cl.
CPC ................................ *H05K 7/20945* (2013.01)
(58) Field of Classification Search
CPC .......... G06F 1/20; G06F 1/329; G06F 1/3293; G06F 9/5094; H05K 7/20836; H05K 7/20945
See application file for complete search history.

(56) References Cited

U.S. PATENT DOCUMENTS 7,620,613 B1 * 11/2009 Moore ............... H05K 7/20836
706/14
7,676,280 B1 * 3/2010 Bash .................. H05K 7/20836
700/17

(Continued)

FOREIGN PATENT DOCUMENTS

CN     102929687 B    5/2016
CN     109800066 A    5/2019

OTHER PUBLICATIONS

Extended European Search Report in European Appln No. 22774264. 0, dated Aug. 6, 2024, 12 pages.

*Primary Examiner* — Vincent H Tran
(74) *Attorney, Agent, or Firm* — Fish & Richardson P.C.

(57) ABSTRACT

The present disclosure relates to energy-saving methods applied to a machine room. One example machine room includes a plurality of cabinets and at least one temperature regulating device, each cabinet includes at least one server, each server is configured to provide a computing resource, and each temperature regulating device is configured to regulate a temperature of the machine room. The machine room is further provided with a facility management device, and the facility management device is configured to manage the computing resource and the temperature regulating device that are in the machine room. One example method includes obtaining cooling capacity conduction relationship information of the machine room and computing resource status information of the machine room, and triggering, based on the cooling capacity conduction relationship information and the computing resource status information, the facility management device to execute a computing resource management instruction set.

20 Claims, 4 Drawing Sheets

| L1 | | R1 |
|----|----|----|
| L2 | | R2 |
| A1 | | A3 |
| L3 | | R3 |
| L4 | Cold | R4 |
| L5 | aisle | R5 |
| L6 | | R6 |
| A2 | | A4 |
| L7 | | R7 |
| L8 | | R8 |

(56) References Cited

U.S. PATENT DOCUMENTS

| | | | |
|---|---|---|---|
| 8,560,677 B2 * | 10/2013 | VanGilder | G06F 1/206 |
| | | | 709/224 |
| 8,782,234 B2 * | 7/2014 | Pienta | G06F 1/329 |
| | | | 709/226 |
| 2009/0292811 A1 | 11/2009 | Pienta et al. | |
| 2011/0113273 A1 * | 5/2011 | Okitsu | G06F 1/206 |
| | | | 713/320 |
| 2011/0238340 A1 * | 9/2011 | Dasgupta | G06F 30/00 |
| | | | 702/61 |
| 2012/0030356 A1 * | 2/2012 | Fletcher | G06F 9/5094 |
| | | | 709/226 |
| 2013/0081048 A1 * | 3/2013 | Kobayashi | G05D 23/1934 |
| | | | 718/105 |
| 2016/0234972 A1 * | 8/2016 | Billet | H05K 7/20836 |

* cited by examiner

| L1 | | R1 |
|----|--|----|
| L2 | | R2 |
| A1 | | A3 |
| L3 | | R3 |
| L4 | Cold aisle | R4 |
| L5 | | R5 |
| L6 | | R6 |
| A2 | | A4 |
| L7 | | R7 |
| L8 | | R8 |

S101: An energy-saving device obtains cooling capacity conduction relationship information of a machine room and computing resource status information of the machine room S102: The energy-saving device triggers, based on the cooling capacity conduction relationship information and the computing resource status information, a facility management device to execute a computing resource management instruction set, so as to minimize a total power of the machine room while meeting a service requirement

FIG. 5

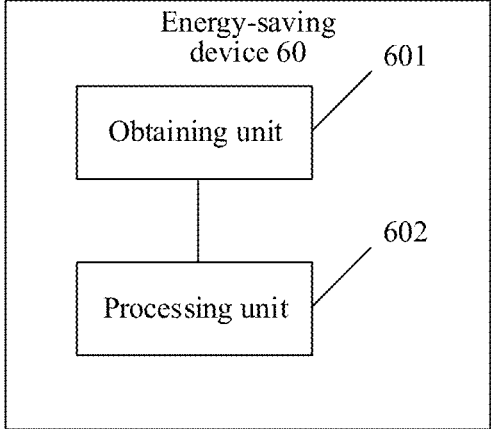

Energy-saving device 60

Obtaining unit    601

Processing unit    602

FIG. 6

ENERGY-SAVING METHOD APPLIED TO MACHINE ROOM, APPARATUS, AND SYSTEM

CROSS-REFERENCE TO RELATED APPLICATIONS

This application is a continuation of International Application No. PCT/CN2022/082480, filed on Mar. 23, 2022, which claims priority to Chinese Patent Application No. 202110321118.4, filed on Mar. 25, 2021. The disclosures of the aforementioned applications are hereby incorporated by reference in their entireties.

TECHNICAL FIELD

This application relates to the field of computer technologies, and in particular, to an energy-saving method applied to a machine room, an apparatus, and a system.

BACKGROUND

A machine room usually stores a server and an air conditioner. The server provides an information technology (information technology, IT) service for a user, and the air conditioner is configured to control an air temperature of the machine room, so that the server and other auxiliary apparatuses in the machine room can work within a proper temperature/humidity range.

Power consumption of the machine room includes IT power consumption generated by the server and cooling power consumption generated by the air conditioner. Therefore, how to save the power consumption of the machine room is considered from the perspective of the two parts. Because a server system receives an external task (for example, a virtual machine creation task) in real time, and allocates the task to one of servers for execution according to a task scheduling algorithm, executing the task occupies a central processing unit (central processing unit, CPU) resource of the server, and further increases an IT load. This increases the IT power consumption and the cooling power consumption. Therefore, how to formulate an appropriate task scheduling algorithm is very important for saving the total power consumption of the machine room. In addition, an air conditioner system is responsible for processing heat generated by an IT system that is in the machine room. Based on a relationship between power consumption and heat, the heat generated by the IT system is approximately equal to the IT power consumption. Therefore, when the air conditioner system meets a cooling capacity requirement, how to dynamically regulate a setting temperature and an air outlet volume based on the IT power consumption is critical to saving the cooling power consumption of the machine room.

Currently, task schedule instructions and temperature setting parameters are generally determined by building prediction models. Specifically, data such as resource utilization of a server, an air conditioner system parameter of the machine room, total power consumption of the machine room, and an external environment parameter in a long period of time is collected, and model training is performed based on the collected data to obtain a total power consumption prediction model and an air conditioner parameter prediction model. Total power consumption and air conditioner parameters that are generated by scheduling each task to servers are sequentially predicted based on the prediction models, so that a server with minimum total power consumption may be selected as a target server for executing each task, and a corresponding air conditioner parameter is a final setting parameter of the air conditioner. However, in this manner, a large amount of experimental data in various cases needs to be collected for training the models. Therefore, this manner highly depends on the sample data. However, it is difficult for the sample data to meet complex and changeable requirements during actual machine room running. How to reduce the overall power consumption of the machine room is an urgent problem to be resolved by a person skilled in the art.

SUMMARY

This application provides an energy-saving method and a related apparatus used in a machine room, to minimize a total power of a machine room while meeting a service requirement.

According to a first aspect, this application provides an energy-saving method applied to a machine room. The machine room includes a plurality of cabinets and at least one temperature regulating device, each cabinet includes at least one server, each server is configured to provide a computing resource, and each temperature regulating device is configured to regulate a temperature of the machine room. The machine room is further provided with a facility management device, and the facility management device is configured to manage the computing resource and the temperature regulating device that are in the machine room. The method includes: obtaining cooling capacity conduction relationship information of the machine room and computing resource status information of the machine room; and triggering, based on the cooling capacity conduction relationship information and the computing resource status information, the facility management device to execute a computing resource management instruction set, so as to minimize a total power of the machine room while meeting a service requirement. The cooling capacity conduction relationship information is for determining a capability of each cabinet in the machine room to absorb a cooling capacity of each temperature regulating device in the machine room, and the computing resource status information is for determining a running location and a running status that are of the computing resource included in the machine room. According to the method, the total power of the machine room can be minimized while the service requirement is met.

With reference to the first aspect, in a possible implementation, the computing resource management instruction set is a computing resource adjustment instruction set, and the computing resource adjustment instruction set is for adjusting a running location of at least one computing resource in the machine room.

With reference to the first aspect, in a possible implementation, the triggering, based on the cooling capacity conduction relationship information and the computing resource status information, the facility management device to execute a computing resource management instruction set includes: determining a to-be-migrated computing resource in the machine room based on the computing resource status information; determining a target server for the to-be-migrated computing resource based on the cooling capacity conduction relationship information and the computing resource status information, where a total power that is of the machine room and that is required after the to-be-migrated computing resource is migrated to the target server is less than a total power that is of the machine room and that is required before the migration; and generating, as the computing resource adjustment instruction set, an instruction set for migrating the to-be-migrated computing resource to the target server.

With reference to the first aspect, in a possible implementation, the determining a target server for the to-be-migrated computing resource based on the cooling capacity conduction relationship information and the computing resource status information includes: determining, for the to-be-migrated computing resource based on the cooling capacity conduction relationship information and the computing resource status information, a plurality of candidate servers and a candidate total power corresponding to each candidate server, where the candidate total power is a total power that is of the machine room and that is required if the to-be-migrated computing resource is migrated to each candidate server; and selecting, from the plurality of candidate servers, a candidate server with a lowest corresponding candidate total power as the target server. In a manner of selecting the candidate server with the lowest corresponding candidate total power, the total power that is of the machine room and that is required after the migration may be lower than the total power that is of the machine room and that is required before the migration.

With reference to the first aspect, in a possible implementation, the determining, for the to-be-migrated computing resource based on the cooling capacity conduction relationship information and the computing resource status information, a plurality of candidate servers and a candidate total power corresponding to each candidate server includes: determining partition cooling capacity absorption relationship information and cooling capacity sharing relationship information based on the cooling capacity conduction relationship information; determining a to-be-selected partition combination set based on the partition cooling capacity absorption relationship information and the cooling capacity sharing relationship information; and determining the plurality of candidate servers and the candidate total power corresponding to each candidate server for the to-be-migrated computing resource based on the cooling capacity conduction relationship information, the to-be-selected partition combination set, and the computing resource status information, where the plurality of candidate servers belong to the to-be-selected partition combination set, where the partition cooling capacity absorption relationship information indicates a capability of a cabinet in each partition in the machine room to absorb a cooling capacity of a temperature regulating device in the partition, and one partition includes one temperature regulating device and at least one cabinet; the cooling capacity sharing relationship information indicates a capability of a cabinet in one partition to share a cooling capacity of a temperature regulating device in the other partition between every two partitions in the machine room; and the to-be-selected partition combination set includes a plurality of to-be-selected partition combinations having different partition quantities, where one to-be-selected partition combination is a partition combination having a strongest cooling capacity absorption capability and a strongest cooling capacity sharing capability in one or more partition combinations having a same partition quantity.

With reference to the first aspect, in a possible implementation, the determining the plurality of candidate servers for the to-be-migrated computing resource based on the cooling capacity conduction relationship information, the to-be-selected partition combination set, and the computing resource status information includes: determining, for the to-be-migrated computing resource based on the computing resource status information, an alternate server in each cabinet in each to-be-selected partition combination in the to-be-selected partition combination set, where a first power variation is not greater than a second power variation, the first power variation is a power variation that is of the alternate server and that is required if the to-be-migrated computing resource is migrated to the alternate server, and the second power variation is a power variation that is of a server other than the alternate server in a same cabinet and that is required if the to-be-migrated computing resource is migrated to the server other than the alternate server; determining, based on the computing resource status information and the cooling capacity conduction relationship information, a power balance degree corresponding to each cabinet, where the power balance degree is a power balance degree that is of the to-be-selected partition combination to which each cabinet belongs and that is required if the to-be-migrated computing resource is migrated to the alternate server in each cabinet; and using an alternate server in a cabinet with a minimum corresponding power balance degree in each to-be-selected partition combination to form the plurality of candidate servers. A smaller power balance degree indicates more balanced powers between cabinets in the to-be-selected partition combination. In this way, a temperature control power of the temperature regulating device is low. In addition, because the power variation corresponding to the alternate server is also small, when the to-be-migrated computing resource is migrated to these servers, a calculation power of the servers is reduced, so that the total power that is of the machine room and that is required after the migration is less than the total power that is of the machine room and that is required before the migration.

With reference to the first aspect, in a possible implementation, the method further includes: determining, based on one or more of a quantity of CPU cores of the to-be-migrated computing resource, CPU utilization of the to-be-migrated computing resource, a quantity of CPU cores of the alternate server, or no load power consumption or full load power consumption of the alternate server, the power variation that is of the alternate server and that is required if the to-be-migrated computing resource is migrated to the alternate server.

With reference to the first aspect, in a possible implementation, the method further includes: determining a normalized power of each cabinet based on cooling capacity conduction relationship information between each cabinet and a temperature regulating device of a partition in which each cabinet is located and a power that is of each cabinet and that is required if the to-be-migrated computing resource is migrated to the alternate server in each cabinet; and determining, based on the normalized power of each cabinet, the power balance degree corresponding to each cabinet.

With reference to the first aspect, in a possible implementation, the quantity of CPU cores of the alternate server is not less than a sum of the quantity of CPU cores of the to-be-migrated computing resource and a quantity of CPU cores of an existing computing resource in the alternate server; and/or a memory specification of the alternate server is not less than a sum of a memory specification of the to-be-migrated computing resource and a memory specification of the existing computing resource in the alternate server.

With reference to the first aspect, in a possible implementation, the determining a target server for the to-be-migrated computing resource based on the cooling capacity conduction relationship information and the computing resource status information includes: determining an alternate server in each cabinet in the machine room for the to-be-migrated computing resource based on the computing resource status information, where a first power variation is not greater than a second power variation, the first power variation is a power variation that is of the alternate server and that is required if the to-be-migrated computing resource is migrated to the alternate server, and the second power variation is a power variation that is of a server other than the alternate server in a same cabinet and that is required if the to-be-migrated computing resource is migrated to the server other than the alternate server; determining, based on the computing resource status information and the cooling capacity conduction relationship information, a power balance degree corresponding to each cabinet, where the power balance degree is a power balance degree that is of the machine room and that is required if the to-be-migrated computing resource is migrated to the alternate server in each cabinet; and selecting, as the target server, an alternate server in a cabinet with a minimum corresponding power balance degree in the plurality of cabinets. In this manner, the alternate server in each cabinet in the machine room may be selected, and a plurality of alternate servers are servers with minimum corresponding power variations. In this way, assuming that the to-be-migrated computing resource is migrated to these servers, a calculation power of the servers is reduced. Further, the alternate server in the cabinet with the minimum power balance degree in the plurality of cabinets is then selected as the target server, so that a temperature control power that is of the temperature regulating device and that is required if migration is performed may be reduced, so that a total power that is of the machine room and that is required after the migration may be less than a total power that is of the machine room and that is required before the migration.

With reference to the first aspect, in a possible implementation, the method further includes: calculating a power that is of each of the plurality of cabinets and that is required if the computing resource adjustment instruction set is executed; determining a temperature setting parameter of each of the at least one temperature regulating device based on the power of each of the plurality of cabinets, where the temperature setting parameter is for meeting temperature requirements that are of the plurality of cabinets and that are generated after the computing resource adjustment instruction set is executed; and triggering the facility management device to execute a temperature regulation instruction set, where the temperature regulation instruction set is generated based on the temperature setting parameter. In this manner, the temperature regulation instruction set of the temperature regulating device may be determined based on the computing resource adjustment instruction set.

With reference to the first aspect, in a possible implementation, the method further includes: calculating a power that is of each of the plurality of cabinets and that is required if the computing resource adjustment instruction set is executed; determining a temperature setting parameter of each temperature regulating device based on a power of a cabinet included in a partition in which each temperature regulating device is located; and triggering the facility management device to execute a temperature regulation instruction set, where the temperature regulation instruction set is generated based on the temperature setting parameter.

With reference to the first aspect, in a possible implementation, the computing resource management instruction set is a computing resource allocation instruction set, and the computing resource allocation instruction set is for allocating at least one computing resource in the machine room.

With reference to the first aspect, in a possible implementation, the triggering, based on the cooling capacity conduction relationship information and the computing resource status information, the facility management device to execute a computing resource management instruction set includes: receiving a service requirement, where the service requirement is for requesting to run the computing resource in the machine room; determining, based on the service requirement, the cooling capacity conduction relationship information, and the computing resource status information, a target computing resource that meets the service requirement and a target server that provides the target computing resource, where an increment between total powers that are of the machine room and that are required before and after the target server provides the target computing resource is minimized; and generating, as the computing resource allocation instruction set, an instruction set for allocating the target computing resource by the target server.

With reference to the first aspect, in a possible implementation, the determining, based on the service requirement, the cooling capacity conduction relationship information, and the computing resource status information, a target computing resource that meets the service requirement and a target server that provides the target computing resource includes: determining, for the target computing resource based on the service requirement, the cooling capacity conduction relationship information, and the computing resource status information, a plurality of candidate servers and a candidate increment corresponding to each candidate server, where the candidate increment is an increment of a total power that is of the machine room and that is required if the target computing resource is migrated to each candidate server; and selecting, from a set of the plurality of candidate servers, a candidate server with a lowest corresponding candidate increment as the target server. In a manner of selecting the candidate server with the minimum corresponding candidate increment, an increment between total powers that are of the machine room and that are required before and after the computing resource allocation instruction set is executed can be minimized.

With reference to the first aspect, in a possible implementation, the determining, for the target computing resource based on the service requirement, the cooling capacity conduction relationship information, and the computing resource status information, a plurality of candidate servers and a candidate increment corresponding to each candidate server includes: determining partition cooling capacity absorption relationship information and cooling capacity sharing relationship information based on the cooling capacity conduction relationship information; determining a to-be-selected partition combination set based on the partition cooling capacity absorption relationship information and the cooling capacity sharing relationship information; and determining the plurality of candidate servers and the candidate increment corresponding to each candidate server for the target computing resource based on the service requirement, the cooling capacity conduction relationship information, the to-be-selected partition combination set, and the computing resource status information, where the plurality of candidate servers belong to the to-be-selected partition combination set, where the partition cooling capacity absorption relationship information indicates a capability of a cabinet in each partition in the machine room to absorb a cooling capacity of a temperature regulating device in the partition, and one partition includes one temperature regulating device and at least one cabinet; the cooling capacity sharing relationship information indicates a capability of a cabinet in one partition to share a cooling capacity of a temperature regulating device in the other partition between every two partitions in the machine room; and the to-be-selected partition combination set includes a plurality of to-be-selected partition combinations having different partition quantities, where one to-be-selected partition combination is a partition combination having a strongest cooling capacity absorption capability and a strongest cooling capacity sharing capability in one or more partition combinations having a same partition quantity.

With reference to the first aspect, in a possible implementation, the determining the plurality of candidate servers for the target computing resource based on the service requirement, the cooling capacity conduction relationship information, the to-be-selected partition combination set, and the computing resource status information includes: determining, for the target computing resource based on the service requirement and the computing resource status information, an alternate server in each cabinet in each to-be-selected partition combination in the to-be-selected partition combination set, where the alternate server has a capability of providing the target computing resource, and a third power variation is not greater than a fourth power variation, where the third power variation is a power variation that is of the alternate server and that is required if the target computing resource is migrated to the alternate server, and the fourth power variation is a power variation that is of a server other than the alternate server in a same cabinet and that is required if the target computing resource is migrated to the server other than the alternate server; determining, based on the computing resource status information and the cooling capacity conduction relationship information, a power balance degree corresponding to each cabinet, where the power balance degree is a power balance degree that is of the to-be-selected partition combination to which each cabinet belongs and that is required if the target computing resource is migrated to the alternate server in each cabinet; and using an alternate server in a cabinet with a minimum corresponding power balance degree in each to-be-selected partition combination to form the plurality of candidate servers. A smaller power balance degree indicates more balanced powers between cabinets in the to-be-selected partition combination. In this way, a temperature control power of the temperature regulating device is low. In addition, because the power variation corresponding to the alternate server is also small, when the target computing resource is allocated to these servers, an increment of a calculation power of the servers is small, so that the increment between the total powers that are of the machine room and that are required before and after the computing resource allocation instruction set is executed can be minimized.

With reference to the first aspect, in a possible implementation, the method further includes: determining, based on one or more of a quantity of CPU cores of the target computing resource, CPU utilization of the target computing resource, a quantity of CPU cores of the alternate server, or no load power consumption or full load power consumption of the alternate server, the power variation that is of the alternate server and that is required if the target computing resource is migrated to the alternate server.

With reference to the first aspect, in a possible implementation, the method further includes: determining a normalized power of each cabinet based on cooling capacity conduction relationship information between each cabinet and a temperature regulating device of a partition in which each cabinet is located and a power that is of each cabinet and that is required if the target computing resource is migrated to the alternate server in each cabinet; and determining, based on the normalized power of each cabinet, the power balance degree corresponding to each cabinet.

With reference to the first aspect, in a possible implementation, the quantity of CPU cores of the alternate server is not less than a sum of the quantity of CPU cores of the target computing resource and a quantity of CPU cores of an existing computing resource in the alternate server; and/or a memory specification of the alternate server is not less than a sum of a memory specification of the target computing resource and a memory specification of the existing computing resource in the alternate server.

With reference to the first aspect, in a possible implementation, the triggering, based on the cooling capacity conduction relationship information and the computing resource status information, the facility management device to execute a computing resource management instruction set includes: determining, for the target computing resource based on the computing resource status information, an alternate server in each cabinet in the machine room, where the alternate server has a capability of providing the target computing resource, and a third power variation is not greater than a fourth power variation, where the third power variation is a power variation that is of the alternate server and that is required if the target computing resource is migrated to the alternate server, and the fourth power variation is a power variation that is of a server other than the alternate server in a same cabinet and that is required if the target computing resource is migrated to the server other than the alternate server; determining, based on the computing resource status information and the cooling capacity conduction relationship information, a power balance degree corresponding to each cabinet, where the power balance degree is a power balance degree that is of the machine room and that is required if the target computing resource is migrated to the alternate server in each cabinet; and selecting, as the target server, an alternate server in a cabinet with a minimum corresponding power balance degree in the plurality of cabinets. In this manner, the alternate server in each cabinet in the machine room may be selected, and a plurality of alternate servers are servers with minimum corresponding power variations. In this way, assuming that the target computing resource is allocated to these servers, an increment of a calculation power of the servers is small. Further, the alternate server in the cabinet with the minimum power balance degree in the plurality of cabinets is then selected as the target server, so that an increment of a temperature control power that is of the temperature regulating device and that is required if migration is performed may be small, so that an increment of a total power that is of the machine room and that is required after the migration may be small. With reference to the first aspect, in a possible implementation, the method further includes: obtaining a power that is of each of the plurality of cabinets and that is required if the computing resource allocation instruction set is executed; determining a temperature setting parameter of each of the at least one temperature regulating device based on the power of each of the plurality of cabinets, where the temperature setting parameter is for meeting temperature requirements that are of the plurality of cabinets and that are required after the computing resource allocation instruction set is executed; and triggering the facility management device to execute a temperature regulation instruction set generated based on the temperature setting parameter.

With reference to the first aspect, in a possible implementation, the method further includes: calculating a power that is of each of the plurality of cabinets and that is required if the computing resource allocation instruction set is executed; determining a temperature setting parameter of each temperature regulating device based on a power of a cabinet included in a partition in which each temperature regulating device is located; and triggering the facility management device to execute a temperature regulation instruction set, where the temperature regulation instruction set is generated based on the temperature setting parameter.

With reference to the first aspect, in a possible implementation, the total power of the machine room includes a calculation power of the plurality of cabinets and a temperature control power of the at least one temperature regulating device.

With reference to the first aspect, in a possible implementation, a first cabinet is included in the plurality of cabinets, a first temperature regulating device is included in the at least one temperature regulating device, and the method further includes: determining cooling capacity conduction relationship information between the first cabinet and the first temperature regulating device based on a first temperature, a second temperature, a first air inlet temperature, and a second air inlet temperature, where the first air inlet temperature is an air inlet temperature that is of the first cabinet and that is obtained by simulating running of the machine room based on a first setting model, the first setting model is constructed based on the machine room, and the first setting model includes the plurality of cabinets of a first power and the at least one temperature regulating device of the first temperature; and the second air inlet temperature is an air inlet temperature that is of the first cabinet and that is obtained by simulating running of the machine room based on a second setting model, the second setting model is constructed based on the machine room, and the second setting model includes the plurality of cabinets of the first power, the first temperature regulating device of the second temperature, and a temperature regulating device other than the first temperature regulating device in the at least one temperature regulating device of the first temperature.

With reference to the first aspect, in a possible implementation, the machine room includes a first partition, the first partition includes a second temperature regulating device and at least one second cabinet, and the method further includes: determining partition cooling capacity absorption relationship information of the first partition based on a capability of each of the at least one second cabinet to absorb a cooling capacity of the second temperature regulating device.

With reference to the first aspect, in a possible implementation, the machine room includes a first partition and a second partition, the first partition includes a second temperature regulating device and at least one second cabinet, and the second partition includes a third temperature regulating device and at least one third cabinet; and the method further includes: determining cooling capacity sharing relationship information between the first partition and the second partition based on a capability of each of the at least one second cabinet to absorb a cooling capacity of the third temperature regulating device and a capability of each of the at least one third cabinet to absorb a cooling capacity of the second temperature regulating device.

With reference to the first aspect, in a possible implementation, the machine room includes a first partition, and the first partition includes a second temperature regulating device and at least one second cabinet; and a capability of each second cabinet to absorb a cooling capacity of the second temperature regulating device is stronger than a capability of each second cabinet to absorb a cooling capacity of a temperature regulating device other than the second temperature regulating device in the at least one temperature regulating device.

According to a second aspect, embodiments of this application provide an energy-saving device. The energy-saving device is configured to save power consumption of a machine room. The machine room includes a plurality of cabinets and at least one temperature regulating device, each cabinet includes at least one server, each server is configured to provide a computing resource, and each temperature regulating device is configured to regulate a temperature of the machine room. The machine room is further provided with a facility management device, and the facility management device is configured to manage the computing resource and the temperature regulating device that are in the machine room. The energy-saving device includes an obtaining unit and a processing unit. The obtaining unit is configured to obtain cooling capacity conduction relationship information of the machine room and computing resource status information of the machine room. The processing unit is configured to trigger, based on the cooling capacity conduction relationship information and the computing resource status information, the facility management device to execute a computing resource management instruction set, so as to minimize a total power of the machine room while meeting a service requirement. The cooling capacity conduction relationship information is for determining a capability of each cabinet in the machine room to absorb a cooling capacity of each temperature regulating device in the machine room, and the computing resource status information is for determining a running location and a running status that are of the computing resource included in the machine room.

With reference to the second aspect, in a possible implementation, the computing resource management instruction set is a computing resource adjustment instruction set, and the computing resource adjustment instruction set is for adjusting a running location of at least one computing resource in the machine room.

With reference to the second aspect, in a possible implementation, the processing unit is specifically configured to: determine a to-be-migrated computing resource in the machine room based on the computing resource status information; determine a target server for the to-be-migrated computing resource based on the cooling capacity conduction relationship information and the computing resource status information, where a total power that is of the machine room and that is required after the to-be-migrated computing resource is migrated to the target server is less than a total power that is of the machine room and that is required before the migration; and generate, as the computing resource adjustment instruction set, an instruction set for migrating the to-be-migrated computing resource to the target server.

With reference to the second aspect, in a possible implementation, the processing unit is specifically configured to: determine, for the to-be-migrated computing resource based on the cooling capacity conduction relationship information and the computing resource status information, a plurality of candidate servers and a candidate total power corresponding to each candidate server, where the candidate total power is a total power that is of the machine room and that is required if the to-be-migrated computing resource is migrated to each candidate server; and select, from the plurality of candidate servers, a candidate server with a lowest corresponding candidate total power as the target server.

With reference to the second aspect, in a possible implementation, the processing unit is further configured to: calculate a power that is of each of the plurality of cabinets and that is required if the computing resource adjustment instruction set is executed; determine a temperature setting parameter of each of the at least one temperature regulating device based on the power of each of the plurality of cabinets, where the temperature setting parameter is for meeting temperature requirements that are of the plurality of cabinets and that are generated after the computing resource adjustment instruction set is executed; and trigger the facility management device to execute a temperature regulation instruction set, where the temperature regulation instruction set is generated based on the temperature setting parameter.

With reference to the second aspect, in a possible implementation, the computing resource management instruction set is a computing resource allocation instruction set, and the computing resource allocation instruction set is for allocating at least one computing resource in the machine room.

With reference to the second aspect, in a possible implementation, the processing unit is specifically configured to: receive a service requirement, where the service requirement is for requesting to run the computing resource in the machine room; determine, based on the service requirement, the cooling capacity conduction relationship information, and the computing resource status information, a target computing resource that meets the service requirement and a target server that provides the target computing resource, where an increment between total powers that are of the machine room and that are required before and after the target server provides the target computing resource is minimized; and generate, as the computing resource allocation instruction set, an instruction set for allocating the target computing resource by the target server.

With reference to the second aspect, in a possible implementation, the processing unit is specifically configured to: determine, for the target computing resource based on the service requirement, the cooling capacity conduction relationship information, and the computing resource status information, a plurality of candidate servers and a candidate increment corresponding to each candidate server, where the candidate increment is an increment of a total power that is of the machine room and that is required if the target computing resource is migrated to each candidate server; and select, from a set of the plurality of candidate servers, a candidate server with a lowest corresponding candidate increment as the target server.

With reference to the second aspect, in a possible implementation, the processing unit is further configured to: obtain a power that is of each of the plurality of cabinets and that is required if the computing resource allocation instruction set is executed; determine a temperature setting parameter of each of the at least one temperature regulating device based on the power of each of the plurality of cabinets, where the temperature setting parameter is for meeting temperature requirements that are of the plurality of cabinets and that are required after the computing resource allocation instruction set is executed; and trigger the facility management device to execute a temperature regulation instruction set, where the temperature regulation instruction set is generated based on the temperature setting parameter.

According to a third aspect, this application further provides another energy-saving device. The energy-saving device is configured to save power consumption of a machine room. The machine room includes a plurality of cabinets and at least one temperature regulating device, each cabinet includes at least one server, each server is configured to provide a computing resource, and each temperature regulating device is configured to regulate a temperature of the machine room. The machine room is further provided with a facility management device, and the facility management device is configured to manage the computing resource and the temperature regulating device that are in the machine room. The energy-saving device includes a processor and a memory, where the memory is configured to store program instructions, and the processor is configured to invoke the program instructions to perform the following operations: obtaining cooling capacity conduction relationship information of the machine room and computing resource status information of the machine room; triggering, based on the cooling capacity conduction relationship information and the computing resource status information, the facility management device to execute a computing resource management instruction set, so as to minimize a total power of the machine room while meeting a service requirement. The cooling capacity conduction relationship information is for determining a capability of each cabinet in the machine room to absorb a cooling capacity of each temperature regulating device in the machine room, and the computing resource status information is for determining a running location and a running status that are of the computing resource included in the machine room.

With reference to the third aspect, in a possible implementation, the computing resource management instruction set is a computing resource adjustment instruction set, and the computing resource adjustment instruction set is for adjusting a running location of at least one computing resource in the machine room.

With reference to the third aspect, in a possible implementation, the processor is configured to invoke the program instructions to specifically perform the following operations: determining a to-be-migrated computing resource in the machine room based on the computing resource status information; determining a target server for the to-be-migrated computing resource based on the cooling capacity conduction relationship information and the computing resource status information, where a total power that is of the machine room and that is required after the to-be-migrated computing resource is migrated to the target server is less than a total power that is of the machine room and that is required before the migration; and generating, as the computing resource adjustment instruction set, an instruction set for migrating the to-be-migrated computing resource to the target server.

With reference to the third aspect, in a possible implementation, the processor is configured to invoke the program instructions to specifically perform the following operations: determining, for the to-be-migrated computing resource based on the cooling capacity conduction relationship information and the computing resource status information, a plurality of candidate servers and a candidate total power corresponding to each candidate server, where the candidate total power is a total power that is of the machine room and that is required if the to-be-migrated computing resource is migrated to each candidate server; and selecting, from the plurality of candidate servers, a candidate server with a lowest corresponding candidate total power as the target server.

With reference to the third aspect, in a possible implementation, the processor is configured to invoke the program instructions to specifically perform the following operations: obtaining a power that is of each of the plurality of cabinets and that is required if the computing resource adjustment instruction set is executed; determining a temperature setting parameter of each of the at least one temperature regulating device based on the power of each of the plurality of cabinets, where the temperature setting parameter is for meeting temperature requirements that are of the plurality of cabinets and that are generated after the computing resource adjustment instruction set is executed; and triggering the facility management device to execute a temperature regulation instruction set, where the temperature regulation instruction set is generated based on the temperature setting parameter.

With reference to the third aspect, in a possible implementation, the computing resource management instruction set is a computing resource allocation instruction set, and the computing resource allocation instruction set is for allocating at least one computing resource in the machine room.

With reference to the third aspect, in a possible implementation, the processor is configured to invoke the program instructions to specifically perform the following operations: receiving a service requirement, where the service requirement is for requesting to run the computing resource in the machine room; determining, based on the service requirement, the cooling capacity conduction relationship information, and the computing resource status information, a target computing resource that meets the service requirement and a target server that provides the target computing resource, where an increment between total powers that are of the machine room and that are required before and after the target server provides the target computing resource is minimized; and generating, as the computing resource allocation instruction set, an instruction set for allocating the target computing resource by the target server.

With reference to the third aspect, in a possible implementation, the processor is configured to invoke the program instructions to specifically perform the following operations: determining, for the target computing resource based on the service requirement, the cooling capacity conduction relationship information, and the computing resource status information, a plurality of candidate servers and a candidate increment corresponding to each candidate server, where the candidate increment is an increment of a total power that is of the machine room and that is required if the target computing resource is migrated to each candidate server; and selecting, from a set of the plurality of candidate servers, a candidate server with a lowest corresponding candidate increment as the target server.

With reference to the third aspect, in a possible implementation, the processor is configured to invoke the program instructions to specifically perform the following operations: calculating a power that is of each of the plurality of cabinets and that is required if the computing resource allocation instruction set is executed; determining a temperature setting parameter of each of the at least one temperature regulating device based on the power of each of the plurality of cabinets, where the temperature setting parameter is for meeting temperature requirements that are of the plurality of cabinets and that are required after the computing resource allocation instruction set is executed; and triggering the facility management device to execute a temperature regulation instruction set, where the temperature regulation instruction set is generated based on the temperature setting parameter.

According to a fourth aspect, this application provides a computing resource supply system. The computing resource supply system includes the energy-saving device and the machine room described in any one of the first aspect to the third aspect.

According to a fifth aspect, this application provides a computer-readable storage medium. The computer-readable storage medium is configured to store instructions. When the instructions are executed, the method according to any one of the first aspect to the third aspect is implemented.

According to a sixth aspect, this application provides a computer program or a computer program product, including a code or instructions. When the code or the instructions are run on a computer, the computer is enabled to perform the method according to any one of the first aspect to the third aspect.

BRIEF DESCRIPTION OF DRAWINGS

To describe the technical solutions in embodiments of this application or in a conventional technology more clearly, the following briefly describes the accompanying drawings for describing embodiments.

FIG. 5 is a schematic flowchart of an energy-saving method applied to a machine room according to an embodiment of this application;

FIG. 6 is a schematic diagram of a structure of an energy-saving device according to an embodiment of this application.

DESCRIPTION OF EMBODIMENTS

Figures 1, 2:
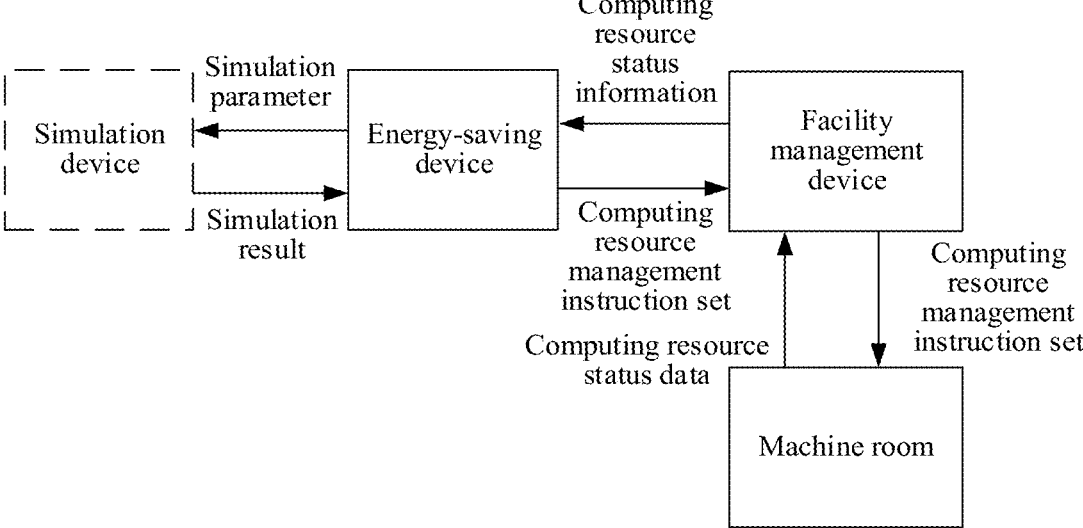
FIG. 1 is a schematic diagram of an architecture of a machine room according to an embodiment of this application.
FIG. 2 is a schematic diagram of an architecture of a computing resource supply system according to an embodiment of this application.

The following describes in detail technical solutions in embodiments of this application with reference to the accompanying drawings.

In the specification, the claims, and the accompanying drawings of this application, the terms "first", "second", and the like are intended to distinguish between different objects but do not indicate a particular order. In addition, the terms "including" and "having" and any other variants thereof are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

An "embodiment" mentioned in this specification means that a particular feature, structure, or characteristic described with reference to this embodiment may be included in at least one embodiment of this application. The phrase shown in various locations in the specification may not necessarily refer to a same embodiment, and is not an independent or alternative embodiment exclusive from another embodiment. It is explicitly and implicitly understood by a person skilled in the art that embodiments described in the specification may be combined with another embodiment.

In this application, "at least one (item)" means one or more, "a plurality of" means two or more, "at least two (items)" means two, three, or more, and "and/or" is used to describe a correspondence relationship between associated objects and indicates that three relationships may exist. For example, "A and/or B" may indicate the following three cases: Only A exists, only B exists, and both A and B exist, where A and B may be singular or plural. The character "/" generally indicates an "or" relationship between the associated objects. "At least one of the following items (pieces)" or a similar expression thereof refers to any combination of these items, including any combination of singular items (pieces) or plural items (pieces). For example, at least one of a, b, or c may indicate a, b, c, a and b, a and c, b and c, or a, b, and c, where a, b, and c may be singular or plural.

The energy-saving method provided in embodiments of this application is applied to a machine room. To better understand this solution, the machine room and related concepts are first described.

A data center (also called a resource center, computing resource center, or computing center) is a set of facilities that centrally provide an information technology (Internet technology, IT) service to the outside. The data center may include not only computer software and hardware systems and other auxiliary devices (such as communication and storage systems) but also data communication connections, environment control devices, monitoring devices, and various security apparatuses. From the space perspective, the data center can be divided into a plurality of machine rooms (or referred to as machine libraries). From the logic perspective, the data center can be divided into three layers: a machine room auxiliary layer, an infrastructure layer, and a software layer. The machine room auxiliary layer includes a cooling device, a power supply device, a fire extinguishing system, and the like, and provides power and a cooling source for the infrastructure layer. The infrastructure layer includes a computing device, a storage device, and a virtualized resource, and is used to carry a service application that is at the software layer. The software layer includes a service application and a cloud platform.

The following describes an impact of the foregoing three layers on a total power of the data center.

The software layer (such as OpenStack) of the data center can receive a task (such as a virtual machine creation task) from the outside of the data center in real time, place the task in a task queue for scheduling, and allocate, according to a task scheduling algorithm, the task to one of servers for execution. Task execution occupies a CPU resource of the server, and consequently increases an IT load, which increases IT power consumption and cooling power consumption. Therefore, how to allocate a received new task or a new task generated by the data center affects the total power of the data center.

The infrastructure layer of the data center usually uses a virtualization technology to virtualize a physical server into a plurality of virtual machines and dynamically allocate the virtual machines to users. A homing relationship between the server and the virtual machine is adjusted, in other words, the virtual machine is migrated from one physical server to another physical server (also called virtual machine migration). This may re-allocate an IT load and affects IT power consumption and cooling power consumption. Therefore, how to migrate the virtual machine for adjustment affects the total power of the data center. At the machine room auxiliary layer of the data center, a cooling system is responsible for taking away heat generated by an IT system that is in the machine room. Based on a relationship between power consumption and heat, the heat generated by the IT system is approximately equal to the IT power consumption. Therefore, when the cooling system meets a cooling capacity requirement, how to dynamically regulate a setting temperature and an air outlet volume of the cooling device based on the IT power consumption affects the total power of the data center.

The machine room is a basic unit of the data center in space. The machine room includes a plurality of cabinets and at least one temperature regulating device. Each cabinet includes at least one server, and each server is configured to provide a computing resource to meet a service requirement (for example, a monitoring task or a security protection task) input by the outside or generated inside the machine room. Each temperature regulating device is configured to regulate a temperature of the machine room, so that the server and another auxiliary apparatus in the machine room can work within a proper temperature/humidity range. The temperature of the machine room may be understood as an indoor temperature, an air temperature, or the like of the machine room. Specifically, in this embodiment of this application, each temperature regulating device is configured to regulate an air inlet temperature of the cabinet, so that the air inlet temperature of the cabinet is not greater than an air inlet temperature upper limit (for example, 28° C. or 27° C.) of the cabinet. The air inlet temperature upper limit of the cabinet may be determined based on a normal operating temperature requirement of the server or the another auxiliary apparatus placed in the cabinet. In this embodiment of this application, the machine room is used as an application scenario to describe an energy-saving method applied to the machine room.

FIG. 1 is a schematic diagram of an architecture of a machine room according to an embodiment of this application. The machine room shown in FIG. 1 includes 16 cabinets (where at least one server may be placed in one cabinet), namely, L1 to L8 and R1 to R8, and four temperature regulating devices (for example, air conditioners, temperature control machines, refrigerating machines, air-cooled devices, or water-cooled devices), namely, A1 to A4.

Power consumption of the machine room includes IT power consumption generated by the server and cooling power consumption (or heating power consumption in some environment conditions) generated by the temperature regulating device. Therefore, how to save the power consumption of the machine room is considered from the perspective of the two parts. Because a server system receives an external task (for example, a virtual machine creation task) in real time, and allocates the task to one of servers for execution according to a task scheduling algorithm, executing the task occupies a central processing unit (central processing unit, CPU) resource of the server, and further increases an IT load. This increases the IT power consumption and the cooling power consumption. Therefore, how to formulate an appropriate task scheduling algorithm is very important for saving the total power consumption of the machine room. In addition, an air conditioner system is responsible for processing heat generated by an IT system that is in the machine room. Based on a relationship between power consumption and heat, the heat generated by the IT system is approximately equal to the IT power consumption. Therefore, when the air conditioner system meets a cooling capacity requirement, how to dynamically regulate a setting temperature and an air outlet volume based on the IT power consumption is critical to saving the cooling power consumption of the machine room.

Currently, task schedule instructions and temperature setting parameters are generally determined by building prediction models. Specifically, data such as resource utilization of a server, an air conditioner system parameter of the machine room, total power consumption of the machine room, and an external environment parameter in a long period of time is collected, and model training is performed based on the collected data to obtain a total power consumption prediction model and an air conditioner parameter prediction model. Total power consumption and air conditioner parameters that are generated by scheduling each task to servers are sequentially predicted based on the prediction models, so that a server with minimum total power consumption may be selected as a target server for executing each task, and a corresponding air conditioner parameter is a final setting parameter of the air conditioner. However, in this manner, a large amount of experimental data in various cases needs to be collected for training the models. Therefore, this manner highly depends on the sample data. However, it is difficult for the sample data to meet complex and changeable requirements during actual machine room running.

In view of the problem existing in the existing situation described above, this application provides an energy-saving method applied to a machine room. The method can minimize a total power of the machine room while meeting a service requirement.

FIG. 2 is a schematic diagram of an architecture of a computing resource supply system according to an embodiment of this application. The computing resource supply system may include a simulation device, an energy-saving device, a facility management device, and a machine room.

For ease of understanding, related terms in embodiments of this application are first explained.

1. Cooling Capacity Conduction Relationship Information

The cooling capacity conduction relationship information is for determining a capability of each cabinet in the machine room to absorb a cooling capacity of each temperature regulating device that is in the machine room. The cooling capacity herein specifically refers to a cooling capacity conducted from the temperature regulating device to the cabinet, or a cooling capacity absorbed by the cabinet from the temperature regulating device. Optionally, the cooling capacity conduction relationship information may also be referred to as heat conduction relationship information. The heat conduction relationship information is for determining a capability of each temperature regulating device in the machine room to absorb heat of each cabinet that is in the machine room. The heat herein specifically refers to heat conducted from the cabinet to the temperature regulating device, or heat absorbed by the temperature regulating device from the cabinet. It can be noted that, if a function of the temperature regulating device is heating, the cooling capacity specifically refers to a cooling capacity conducted from the cabinet to the temperature regulating device, or a cooling capacity absorbed by the temperature regulating device from the cabinet. The heat specifically refers to heat conducted from the temperature regulating device to the cabinet, or heat absorbed by the cabinet from the temperature regulating device.

2. Computing Resource

The computing resource in embodiments of this application may include a server, a virtual machine, a task, and the like that are in a machine room. It may be understood that the server is a hardware device placed in a cabinet, and the virtual machine and the task are software units allocated to the server. It can be noted that in embodiments of this application, at least one computing resource corresponding to a computing resource management instruction set may be the virtual machine or the task. For example, the computing resource management instruction set may be for adjusting a running location of the virtual machine or the task, or allocating (or referred to as creating) the virtual machine or the task in the server based on a service requirement.

3. Computing Resource Status Information

Computing resource status information is for determining a running location and a running status that are of a computing resource included in a machine room. It can be noted that, after an actual machine room is created, a running location (or referred to as location information or coordinate information) of a server relative to a cabinet may be determined. For example, to record the running location of the server, each cabinet and each server may be numbered (or referred to as named or denoted), and there is a correspondence between one number and one piece of location information. For example, refer to FIG. 1. The cabinet L1 corresponds to the $1^{st}$ cabinet from top to bottom on the left side of the machine room. Alternatively, a coordinate system is created based on the machine room, and coordinates of each cabinet and each server are recorded. There is a correspondence between one coordinate and one piece of location information. If a location of the server is moved manually or mechanically, the location information of the server is changed. Generally, the running location of the server is fixed. However, a virtual machine and a task are dynamically allocated to a user for use based on a service requirement, and running locations of the virtual machine and the task may be allocated and moved based on a computing resource management instruction.

For example, a running status of the server may be described by using running data such as a quantity of central processing unit (central processing unit, CPU) cores, a memory specification, no load power consumption, and full load power consumption that are of the server. A running status of the virtual machine may be described by using running data such as a quantity of CPU cores, a memory specification, CPU utilization, and memory utilization that are of the virtual machine. A running status of the task may be described by using data such as a CPU requirement (namely, a quantity of required CPU cores) and a memory requirement required for running the task.

4. Computing Resource Management Instruction Set

A computing resource instruction set includes at least one adjustment or allocation instruction for a computing resource. In a possible implementation, the computing resource management instruction set may be a computing resource adjustment instruction set, and the computing resource adjustment instruction set is for adjusting a running location of at least one computing resource that is in a machine room. In a possible implementation, the computing resource management instruction set may be a computing resource allocation instruction set, and the computing resource allocation instruction set is for allocating the at least one computing resource in the machine room.

The following describes, one by one, composition components in a system architecture to which embodiments of this application are applied.

A simulation device is an electronic device that uses a data center simulation technology to simulate an air flow field and a temperature field that are of a machine room. For example, a control equation of an air flow is solved by using computational fluid dynamic software of a data center, where the air flow field and the temperature field that are of the machine room are simulated mainly by using a law of conservation of mass, a law of momentum change, a first law of thermodynamics, a second law of thermodynamics, a Fourier heat transfer law, and the like.

The simulation device may construct, by using the computational fluid dynamic software based on location information of each composition object (a power supply assembly, a temperature regulating device, a cabinet, a floor, a column, a pipe, and the like) in an actual machine room, a machine room computational fluid dynamic model (which may also be referred to as a virtual machine room) corresponding to the machine room. It can be noted that a cabinet layout, an air conditioner size and position, a machine room height, a cable rack layout, a support beam position, and a column position of the virtual machine room are consistent with those of the actual machine room. After the machine room computational fluid dynamic model is established, the model may be used to simulate different cabinet power consumption and/or the temperature field and the air flow field that are of the machine room in distribution of setting parameters (or referred to as simulation parameters) of the temperature regulating device. In embodiments of this application, the simulation device may construct, based on the location information that is of the composition object and that is collected from the actual machine room, the virtual machine room corresponding to the actual machine room. Then, the virtual machine room is for obtaining air inlet temperatures of cabinets in distribution of setting parameters of different temperature regulating devices, so that an energy-saving device can calculate cooling capacity conduction relationship information of the machine room. Optionally, the simulation device may further receive the simulation parameter sent by the energy-saving device, simulate running of the machine room based on the simulation parameter and the machine room computational fluid dynamic model, and output a simulation result.

A facility management device is configured to manage a computing resource and a temperature regulating device that are in a machine room. Optionally, a shared facility management device (such as a data center infrastructure management (data center infrastructure management, DCIM) device) may be configured in a data center (including one or more machine rooms). Optionally, each machine room is provided with a facility management device corresponding to the machine room, and the DCIM device may manage the facility management device of each machine room. In this embodiment of this application, the facility management device may collect computing resource status data of a temperature regulating device, a cabinet, a server, a virtual machine, a to-be-scheduled task, and the like, to generate computing resource status information; or may control a managed device, for example, regulate a setting parameter of the temperature regulating device, migrate the virtual machine, or schedule the task to a specified server. In addition, the facility management device may further provide a data obtaining interface and a device control interface to the outside for an external system to obtain required data and control device. In this embodiment of this application, the facility management device may obtain the computing resource status information that is in an actual machine room, and send the computing resource status information to an energy-saving device. In addition, the facility management device may further be triggered by the energy-saving device to execute a computing resource management instruction set.

An energy-saving device can interact with a facility management device and a simulation device through interfaces. For example, the energy-saving device may collect computing resource status information of a machine room through the interface with the facility management device, and send a computing resource management instruction set to the facility management device through the interface. The energy-saving device may further send a simulation parameter to the simulation device through the interface with the simulation device, or collect a simulation result (for example, may be a plurality of pieces of temperature data) obtained when the simulation device simulates running of the machine room.

For the machine room, refer to the descriptions of the content corresponding to FIG. 1. Details are not described herein again.

In embodiments of this application, first, the energy-saving device may obtain, from the simulation device, the plurality of pieces of temperature data obtained when the simulation device simulates running of the machine room, and calculate cooling capacity conduction relationship information of the machine room based on the pieces of temperature data. In addition, the energy-saving device may obtain the computing resource status information of the machine room from the facility management device. Then, the energy-saving device triggers, based on the cooling capacity conduction relationship information and the computing resource status information, the facility management device to execute the computing resource management instruction set, so as to minimize a total power of the machine room while meeting a service requirement. In some possible implementations, the energy-saving device may further determine a temperature setting parameter of each temperature regulating device based on a power that is of each of a plurality of cabinets in the machine room and that is required if the computing resource management instruction set is executed, and then trigger the facility management device to execute a temperature regulation instruction set generated based on the temperature setting parameter.

Figure 3:
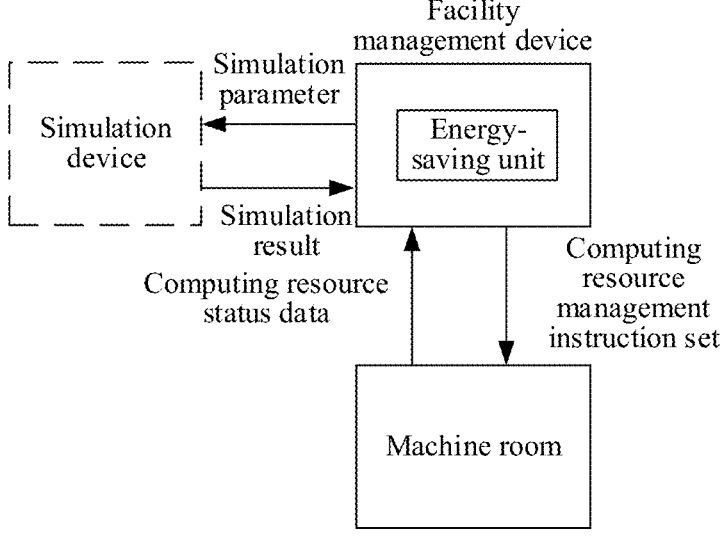
FIG. 3 is a schematic diagram of an architecture of another computing resource supply system according to an embodiment of this application.

FIG. 3 is a schematic diagram of an architecture of another computing resource supply system according to an embodiment of this application. In this optional system architecture, the system includes a simulation device, a facility management device, and a machine room, and the foregoing energy-saving device is integrated in the facility management device.

Figure 4:
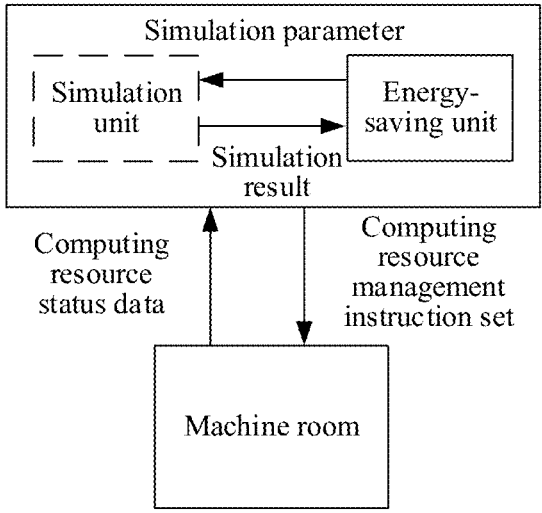
FIG. 4 is a schematic diagram of an architecture of still another computing resource supply system according to an embodiment of this application.

FIG. 4 is a schematic diagram of an architecture of still another computing resource supply system according to an embodiment of this application. In this optional system architecture, the system includes a facility management device and a machine room, and both the foregoing simulation device and energy-saving device are integrated in the facility management device.

The following describes in detail embodiments of this application.

FIG. 5 is a schematic flowchart of an energy-saving method applied to a machine room according to an embodiment of this application. The method may be applied to the computing resource supply system shown in FIG. 2 (or FIG. 3 or FIG. 4). The energy-saving device described below may be the energy-saving device shown in FIG. 2. The machine room described below may be the machine room shown in FIG. 1 or FIG. 2 (or FIG. 3 or FIG. 4). Optionally, in some other possible system architectures (for example, in FIG. 3 or FIG. 4), the energy-saving device may be integrated into a facility management device, and a device that performs the following method may also be the facility management device. The method includes the following steps.

S101: The energy-saving device obtains cooling capacity conduction relationship information of the machine room and computing resource status information of the machine room.

For concepts of the cooling capacity conduction relationship information and the computing resource status information, refer to the descriptions in the foregoing content. Details are not described herein again.

Optionally, the energy-saving device may obtain the computing resource status information of the machine room via the facility management device.

For example, running location information that is of a server and that is included in the computing resource status information may be as follows:

```
{
    "cabinet1": { // Cabinet cabinet1
        "serverList": [ // Three servers named server1, server2, and server3
are placed in the cabinet cabinet1
            "server1",
            "server2",
            "server3"
        ]
    },
    "cabinet2": {
        "serverList": [ // Two servers named server4 and server5 are placed
in the cabinet cabinet2
            "server4",
            "server5"
        ]
    },
    "cabinet3": {
        "serverList": [// One server named server8 is placed in the cabinet
cabinet3
            "server8"
        ]
    }
}
```

For example, running location information that is of a virtual machine and that is included in the computing resource status information may be as follows:

```
{
    "server1": { // Server server1
        "vmList": [ // Three virtual machines named vm1, vm2, and vm3
are deployed on the server server1
            "vm1",
            "vm2",
            "vm3"
        ],
    },
    "server2": {
        "vmList": [// No virtual machine is deployed on the server server2
        ]
    },
    "server3": {
        "vmList": [//One virtual machine named vm5 is deployed on the
server server3
            "vm5"
        ]
    }
}
```

For example, the computing resource status information may further include running status information of the server: a quantity of CPU cores, a memory specification, no load power consumption, full load power consumption, and the like; and running status information of the virtual machine: a quantity of CPU cores, a memory specification, CPU utilization, memory utilization, and the like.

Optionally, the energy-saving device may calculate the cooling capacity conduction relationship information of the machine room based on a plurality of pieces of temperature data obtained through collection when the simulation device simulates running of the machine room. A manner of calculating the cooling capacity conduction relationship information of the machine room is described by using cooling capacity conduction relationship information between a first cabinet and a first temperature regulating device as an example. The first cabinet is any cabinet in the machine room, and the first temperature regulating device is any temperature regulating device in the machine room.

In some embodiments, the energy-saving device determines the cooling capacity conduction relationship information between the first cabinet and the first temperature regulating device based on a first temperature, a second temperature, a first air inlet temperature, and a second air inlet temperature, where the first air inlet temperature is an air inlet temperature that is of the first cabinet and that is obtained by simulating running of the machine room based on a first setting model, the first setting model is constructed based on the machine room, and the first setting model includes a plurality of cabinets of a first power and at least one temperature regulating device of the first temperature; and the second air inlet temperature is an air inlet temperature that is of the first cabinet and that is obtained by simulating running of the machine room based on a second setting model, the second setting model is constructed based on the machine room, and the second setting model includes the plurality of cabinets of the first power, the first temperature regulating device of the second temperature, and a temperature regulating device other than the first temperature regulating device in the at least one temperature regulating device of the first temperature.

The first power, the first temperature, and the second temperature may be sent by the energy-saving device to the simulation device, so that the simulation device sets a running status, of the cabinet or the temperature regulating device, in the first setting model and the second setting model based on the data. The first setting model and the second setting model may be understood as the machine room computational fluid dynamic models described in the foregoing content. The first setting model and the second setting model are constructed based on location information of actual composition objects that are in the machine room.

For example, a request on the setting parameter (to be specific, including the first power and the first temperature) that is of the first setting model and that is sent by the energy-saving device to the simulation device may be:

```
SimulationRequest{
    "CabinetPower": { // Cabinet powers
        "L1": b, // A power of L1 is b KW (namely, the first power)
        "L2": b, // A power of L2 is b KW
        ... // Powers of other cabinets (it may be understood that the
powers of the other cabinets are all set to the first power)
    },
    "CRACSetting": { // Setting parameters of the temperature regulating
device
        "A1": {
```

-continued

```
        "switch":1, //  1 indicates that temperature regulating device
A1 is turned on, and 0 indicates that temperature regulating device A1 is
turned off
        "temp":X   // A setting temperature of temperature regulating
device A1 is X°C (namely, the first temperature)
    },
    "A2": {
        "switch":1,
        "temp":X
    },
    ... // Setting parameters of other temperature regulating devices
A3 and A4 (the other temperature regulating devices are both turned on,
and temperatures are both the first temperature)
    }
}
```

For example, a request on the setting parameter (to be specific, including the first power, the first temperature, and the second temperature) that is of the second setting model and that is sent by the energy-saving device to the simulation device may be:

```
SimulationRequest{
    "CabinetPower": { // Cabinet powers that are consistent with the
cabinet powers in the first setting model
        "L1": b,
        "L2": b,
        ...
    },
    "CRACSetting": { // Setting parameters of the temperature regulating
device, where a temperature of temperature regulating device A1 (namely,
the first temperature regulating device) is set to Y° C. (namely, the second
temperature), and temperatures of other temperature regulating devices are
all the first temperature
        "A1": {
            "switch":1,
            "temp":Y //   A setting temperature of the temperature
regulating device is Y° C.
        },
        "A2": {
            "switch":1,
            "temp":X
        },
        "A3": {
            "switch":1,
            "temp":X
        },
        "A4": {
            "switch":1,
            "temp":X
        },
    }
}
```

The simulation device obtains the first air inlet temperature of the first cabinet through simulating running of the machine room based on the first setting model, and obtains the second air inlet temperature of the first cabinet through simulating running of the machine room based on the second setting model.

For example, for a setting model, a result obtained through running by the simulation device is as follows:

```
SimulationResponse{
    "Cabinet": { // Cabinets
        "L1": {
            "TempIn": y1 // An air inlet temperature of the cabinet L1 is
y1
        },
        "L2": {
            "TempIn": y2 // An air inlet temperature of the cabinet L2 is
y2
```

-continued

```
    },
        ... // Air inlet temperatures of other cabinets
    },
    "CRAC": { // Temperature regulating devices
        "A1": {//Temperature regulating device 1
            "TempIn":x1, // An air inlet temperature of temperature
regulating device A1 is x1
            "TempOut":x2 // An air outlet temperature of temperature
regulating device A1 is x2
            "Flow":x3 // An air flow of temperature regulating device A1
is x3, and a unit is m³/s
        },
        "A2": {//Temperature regulating device 2
            "TempIn":x4,
            "TempOut":x5,
            "Flow":x6
        },
        ... // Air inlet temperatures, air outlet temperatures, and air flows
of other temperature regulating devices A3 and A4
    }
}
```

The energy-saving device may obtain the first air inlet temperature and the second air inlet temperature from the simulation device. It can be noted that, a difference between the first setting model and the second setting model lies only in that the temperature of the first temperature regulating device is adjusted, and a temperature of another temperature regulating device and a power of each cabinet remain unchanged. This may be understood as that an impact of another factor on the air inlet temperature of the first cabinet is limited. In this manner, the cooling capacity conduction relationship information between the first cabinet and the first temperature regulating device may be determined.

In a possible implementation, in this embodiment of this application, a temperature correlation index (temperature correlation index, TCI) is used to describe a capability of a cabinet to absorb a cooling capacity of a temperature regulating device. For example, a larger value indicates a stronger capability of a cabinet to absorb a cooling capacity of a temperature regulating device, in other words, may also indicate a stronger correlation between the cabinet and the temperature regulating device.

Optionally, for a manner of calculating a TCI between the first cabinet and the first temperature regulating device, refer to Formula 1-1:

$$TCI_{11} = \frac{T_1^j - T_1^0}{Y - X} \qquad \text{Formula 1-1}$$

$$T_1^j$$

is the second air inlet temperature, $$T_1^0$$

is the first air inlet temperature, Y is the second temperature, and X is the first temperature. The cooling capacity conduction relationship information between the first cabinet and the first temperature regulating device may be an association relationship between the first cabinet, the first temperature regulating device, and $TCI_{11}$. Cooling capacity conduction relationship information between another cabinet and another temperature regulating device may be calculated in a similar manner described above.

Table 1 records partial cooling capacity conduction relationship information that is in the machine room.

TABLE 1

|     | A1   | A2   | A3   | A4   |
| --- | ---- | ---- | ---- | ---- |
| L1  | 0.64 | 0.08 | 0.33 | 0.07 |
| L2  | 0.72 | 0.08 | 0.28 | 0.06 |
| L3  | 0.75 | 0.11 | 0.31 | 0.08 |
| L4  | 0.76 | 0.13 | 0.29 | 0.09 |
| R1  | 0.31 | 0.07 | 0.66 | 0.07 |
| R2  | 0.24 | 0.06 | 0.78 | 0.08 |
| R3  | 0.24 | 0.09 | 0.78 | 0.09 |
| R4  | 0.27 | 0.1  | 0.74 | 0.11 |
| ... | ...  | ...  | ...  | ...  |

The row identifiers "L1", "L2", "R1", and "R2" indicate identifiers (or labels or numbers) of cabinets. The identifiers correspond to location information of the cabinets. For example, L1 indicates the first cabinet on the left in FIG. 1 that is a schematic diagram of a machine room, and R2 indicates the second cabinet on the right in FIG. 1 that is the schematic diagram of the machine room. The column identifiers "A1", "A2", "A3", and "A4" indicate identifiers of temperature regulating devices, and the identifiers correspond to location information of the temperature regulating devices. For example, A1 indicates the first air conditioner on the left in FIG. 1 that is the schematic diagram of the machine room. A value of each unit represents a value of a TCI between a corresponding cabinet and a corresponding temperature regulating device. For example, when the row identifier is L1 and the column identifier is A1, the value of the TCI is 0.64, indicating that the value of the TCI between the cabinet L1 and temperature regulating device A1 is 0.64, and the value represents a capability of the cabinet L1 to absorb a cooling capacity of temperature regulating device A1.

Optionally, in a possible implementation, a homing relationship (or referred to as a strong association relationship) between a cabinet and a temperature regulating device may be determined based on the cooling capacity conduction relationship information. For example, for the cabinet L1, if a TCI between the cabinet L1 and temperature regulating device A1 is greater than a TCI between the cabinet L1 and another temperature regulating device, this may be considered as that there is a homing relationship between the cabinet L1 and temperature regulating device A1, to be specific, the cabinet L1 is a cabinet belonging to temperature regulating device A1, and temperature regulating device A1 is a home temperature regulating device of the cabinet L1.

S102: The energy-saving device triggers, based on the cooling capacity conduction relationship information and the computing resource status information, the facility management device to execute a computing resource management instruction set, so as to minimize a total power of the machine room while meeting a service requirement.

The total power of the machine room includes a calculation power (which may also be referred to as an IT power or the like) of the plurality of cabinets in the machine room and a temperature control power (which may also be referred to as a cooling power, a heating power, or the like) of the at least one temperature regulating device in the machine room. It can be noted that minimizing the total power of the machine room means that the total power that is of the machine room and that is required when the computing resource management instruction set is executed is less than a total power that is of the machine room and that is required when another management instruction set is executed. In some embodiments, the computing resource management instruction set is a computing resource adjustment instruction set, and the computing resource adjustment instruction set is for adjusting a running location of at least one computing resource in the machine room. It may be understood that the at least one computing resource may be a virtual machine or a task. The computing resource adjustment instruction set may include one or more adjustment instructions for the computing resource. After executing the computing resource adjustment instruction set, the facility management device may adjust the running location of the at least one computing resource, so that an IT load can be reallocated, and this affects a calculation power and a temperature control power. In this embodiment of this application, the total power that is of the machine room and that is required when the computing resource adjustment instruction set is executed is less than a total power that is of the machine room and that is required before the execution.

Optionally, a process in which the energy-saving device triggers, based on the cooling capacity conduction relationship information and the computing resource status information, the facility management device to execute the computing resource management instruction set may include the following steps.

S11: Determine a to-be-migrated computing resource in the machine room based on the computing resource status information.

In some application scenarios, the machine room may periodically update a running location of a virtual machine and/or a task. In this case, all virtual machines and/or tasks included in the machine room may be used as to-be-migrated computing resources.

In some application scenarios, each virtual machine or task has a specified update periodicity. Optionally, update periodicities set for different virtual machines or tasks may be the same, or may be different. When update periodicities of some virtual machines or tasks are reached at a current moment, the virtual machines or tasks may be used as to-be-migrated computing resources.

In some application scenarios, for a service requirement (which may be a service requirement from an outside of the machine room, or may be a service requirement generated by the machine room) newly obtained by the machine room, the machine room may first allocate temporary computing resources for the service requirement, so as to respond to the service requirement in a timely manner, and then adjust the temporary computing resources after a specific time period. In this case, these temporary computing resources may be used as to-be-migrated computing resources. For example, the service requirement in this scenario may be an online service. This type of service is a delay-sensitive service, and has a high requirement on a response speed of the service. For example, a real-time service oriented to a terminal user is an online service. For example, the service requirement may be an e-commerce service, a search service, a recommendation service, or the like.

S12: Determine a target server for the to-be-migrated computing resource based on the cooling capacity conduction relationship information and the computing resource status information.

Specifically, a total power that is of the machine room and that is required after the to-be-migrated computing resource is migrated to the target server is less than a total power that is of the machine room and that is required before the migration. In some embodiments, a manner of determining the target server for the to-be-migrated computing resource based on the cooling capacity conduction relationship information and the computing resource status information may be: determining, for the to-be-migrated computing resource based on the cooling capacity conduction relationship information and the computing resource status information, a plurality of candidate servers and a candidate total power corresponding to each candidate server, where the candidate total power is a total power that is of the machine room and that is required if the to-be-migrated computing resource is migrated to each candidate server; and selecting, from the plurality of candidate servers, a candidate server with a lowest corresponding candidate total power as the target server.

The following describes some methods for determining the candidate server.

In a first possible implementation, to enable the to-be-migrated computing resource to run normally in the target server, it is required that a quantity of CPU cores of the candidate server is not less than a sum of a quantity of CPU cores of the to-be-migrated computing resource and a quantity of CPU cores of an existing computing resource in the candidate server; and/or a memory specification of the candidate server is not less than a sum of a memory specification of the to-be-migrated computing resource and a memory specification of the existing computing resource in the candidate server. Optionally, a further requirement may be further imposed on the candidate server based on a service feature of the to-be-migrated computing resource. For example, if the to-be-migrated computing resource is an authentication task, the candidate server needs to have an authentication function. It can be noted that some other requirements may be further added to the candidate server. This is not specifically limited in this embodiment of this application. In this implementation, a server that meets a running requirement of the to-be-migrated computing resource and that is in the machine room may be used as the candidate server.

In a second possible implementation, the energy-saving device may first select, as an alternate server from a plurality of servers in the machine room, a server that meets a running requirement (referring to descriptions of the first possible implementation) of the to-be-migrated computing resource; and then determine, based on the computing resource status information, a power variation corresponding to each alternate server, where the power variation is a power variation that is of each alternate server and that is required if the to-be-migrated computing resource is migrated to each alternate server. An alternate server with a minimum corresponding power variation in each cabinet form the plurality of candidate servers. In this manner, the plurality of candidate servers are servers with minimum corresponding power variations. In this case, when the to-be-migrated computing resource is migrated to these servers, a calculation power of the servers is reduced, so that the total power that is of the machine room and that is required after the migration is less than the total power that is of the machine room and that is required before the migration.

Optionally, the method further includes: determining, based on one or more of a quantity of CPU cores of the to-be-migrated computing resource, CPU utilization of the to-be-migrated computing resource, a quantity of CPU cores of the alternate server, or no load power consumption or full load power consumption of the alternate server, the power variation that is of the alternate server and that is required if the to-be-migrated computing resource is migrated to the alternate server.

For example, a calculation manner of power variation AP required when virtual machine j is placed in server k is described.

If there is no virtual machine on server k before the assumed migration:

$$\Delta P = P_{idle}^k + \frac{V_{cpu-s}^j * V_{cpu-u}^j}{S_{cpu-s}^k} * (P_{full}^k - P_{idle}^k) \qquad \text{Formula 1-2}$$

If server k includes a virtual machine before the assumed migration, $$\Delta P = \frac{V_{cpu-s}^j * V_{cpu-u}^j}{S_{cpu-s}^k} * (P_{full}^k - P_{idle}^k) \qquad \text{Formula 1-3}$$

$$V_{cpu-s}^j$$

represents a quantity of CPU cores of virtual machine j, $$V_{cpu-u}^j$$

represents CPU utilization of virtual machine j, $$S_{cpu-s}^k$$

represents a quantity of CPU cores of server k, $$P_{idle}^k$$

is no load power consumption of server k, and $$P_{full}^k$$

is full load power consumption of server k. Such data may be obtained from the computing resource status information.

A calculation manner of power variation $\Delta P$ required when virtual machine creation task l is placed in server k is described.

If there is no virtual machine or virtual machine creation task on the server before the assumed migration, $$\Delta P = P_{idle}^k + \frac{T_{cpu}^l}{S_{cpu-s}^k} * (P_{full}^k - P_{idle}^k) \qquad \text{Formula 1-4}$$

If there is the virtual machine or virtual machine creation task on the server before the assumed migration, $$\Delta P = \frac{T_{cpu}^l}{S_{cpu}^k} * \left(P_{full}^k - P_{idle}^k\right)$$

Formula 1-5

$$T_{cpu}^l$$

represents a CPU requirement of the task l, $$S_{cpu-s}^k$$

represents a quantity of CPU cores of server k, $$P_{idle}^k$$

is no load power consumption of server k, and $$P_{full}^k$$

is full load power consumption of server k. Such data may be obtained from the computing resource status information.

It can be noted that there may be another manner of calculating the power variation. Details are not described in this embodiment of this application.

In a third possible implementation, the energy-saving device may first select, as an alternate server from a plurality of servers in the machine room, a server that meets a running requirement (referring to the descriptions of the first possible implementation) of the to-be-migrated computing resource. Then, based on the cooling capacity conduction relationship information and the computing resource status information, a plurality of alternative cabinets that are in the machine room and that have a largest TCI with each temperature regulating device are determined (where for example, in Table 1, a cabinet having a largest TCI with temperature regulating device A1 is cabinet L4), and alternate servers located in the plurality of alternative cabinets are used as the plurality of candidate servers. In this manner, the plurality of candidate servers have the largest TCIs with the temperature regulating device, indicating that cooling capacity absorption capabilities of the candidate servers are stronger. In this case, when the to-be-migrated computing resource is migrated to these servers, a temperature control power of the temperature regulating device is reduced, so that the total power that is of the machine room and that is required after the migration is less than the total power that is of the machine room and that is required before the migration.

It can be noted that the to-be-migrated computing resource may include a plurality of computing resources, and one target server may be determined for each to-be-migrated computing resource. Target servers of different to-be-migrated computing resources may be the same or may be different. A computing resource instruction for migrating each to-be-migrated computing resource to the target server corresponding to the to-be-migrated computing resource forms the computing resource adjustment instruction set.

Optionally, the target servers may be sequentially determined for the to-be-migrated computing resources in descending order of CPU utilization of the to-be-migrated computing resources. Because the to-be-migrated computing resource with high CPU utilization occupies a high power, in this manner, the to-be-migrated computing resource that has a large impact on the total power of the machine room may be first migrated, and this helps reduce the total power of the machine room.

In addition, it can be noted that, after a target server corresponding to a to-be-migrated computing resource is determined, running status information of the target server needs to be updated, and the reason is that the target server needs to reserve computing resources for the to-be-migrated computing resource. In other words, in a process of selecting a target server corresponding to a next to-be-migrated computing resource, computing resource status information updated based on a selection result of a current to-be-selected computing resource is used.

For example, it is assumed that virtual machine 1 is on server1 before migration, and is on server2 after the migration. It is assumed that a change of data structures (or referred to as running location information) of a homing relationship between a server and a virtual machine before and after the migration is as follows:

```
{ // Before migration
    "server1": { // Server 1
        "vmList": [
            "vm1", // Virtual machine 1 is on server1
            "vm2",
            "vm3"
        ]
    },
    "server2": {
        "vmList": [
        ]
    },
    "server3": {
        "vmList": [
            "vm5"
        ]
    }
}
{ // After migration
    "server1": { // Server1, no longer including virtual machine 1
        "vmList": [
            "vm2",
            "vm3"
        ]
    },
    "server2": { // Server2
        "vmList": [
            "vm1", // Virtual machine 1 has been migrated from server1 to
                server2
        ]
    },
    "server3": {
        "vmList": [
            "vm5"
        ]
    }
}
```

The following describes a manner of determining the total candidate power corresponding to each candidate server. The method may include the following steps.

Step a1: Obtain a power that is of each of the plurality of cabinets and that is required if the to-be-migrated computing resource is migrated to one candidate server.

Optionally, CPU utilization $S_{cpu-u}$ that is of each server and that is required if the migration is performed is first calculated.

CPU utilization of a server is obtained by dividing, by a quantity of CPU cores of the server, a result of a sum of CPU loads of all virtual machines on the server plus a sum of CPU requirements for virtual machine creation tasks on the server. A quantity of CPU cores of the virtual machine multiplied by CPU utilization of the virtual machine equals the CPU load of the virtual machine.

$$S_{cpu-u}^{k}$$

indicates CPU utilization of server k.

Then, a power $P_{server}$ of each server is calculated. If the server includes a virtual machine, $$P_{server}^{k} = P_{idle}^{k} + S_{cpu-u}^{k} * \left( P_{full}^{k} - P_{idle}^{k} \right).$$

$$P_{server}^{k}$$

indicates a power of server k, $$P_{full}^{k}$$

is the full load power consumption of server k, and $$P_{idle}^{k}$$

is the no load power consumption of server k. The power of the server is linearly related to the CPU utilization of the server.

If there is no virtual machine on the server, $$P_{server}^{k} = 0,$$

indicating that a power of server k is 0.

Then, a power $P_{rack}$ of each cabinet is calculated. The cabinet power is equal to a sum of powers of all servers in the cabinet.

$$P_{rack}^{i}$$

indicates a power of an $i^{th}$ cabinet.

Step b1: Determine the calculation power of the plurality of cabinets based on the power of each cabinet. Specifically, the calculation power of the plurality of cabinets is a sum of powers of all the cabinets.

Step c1: Determine a temperature setting parameter of each of the at least one temperature regulating device based on the power of each of the plurality of cabinets, where the temperature setting parameter is for meeting temperature requirements that are of the plurality of cabinets and that are required after the to-be-migrated computing resource is migrated to one candidate server.

For a manner of determining the temperature setting parameter of each temperature regulating device, refer to the following descriptions.

First, the energy-saving device sends the power (obtained through calculation in step S21) of each cabinet and a simulated temperature value of the temperature regulating device (initially, a running status of each temperature regulating device is on, and an initial temperature is a settable maximum temperature Z° C. (for example, 35° C.)) to a simulation device as input parameters, so that the simulation device simulates running of the machine room based on the input parameters. It can be noted that, if powers of all cabinets of a temperature regulating device that serves as a home temperature regulating device are all 0, a running status of the temperature regulating device may be set to off.

Then, an air inlet temperature $T_i$ of each cabinet, an air inlet temperature $$T_j^{in}$$

of each air conditioner, an air outlet temperature $$T_j^{out}$$

of each air conditioner, and an air flow $M_j$ of each air conditioner are obtained from the simulation device. $T_i$ indicates an air inlet temperature of an $i^{th}$ cabinet, $$T_j^{in}$$

indicates an air inlet temperature of a $j^{th}$ air conditioner, $$T_j^{out}$$

indicates an air outlet temperature of the $j^{th}$ air conditioner, and $M_j$ indicates an air flow of the $j^{th}$ air conditioner.

For example, a request on the input parameters sent by the energy-saving device to the simulation device may be:

```
SimulationRequest{
    "CabinetPower": { // Cabinet powers
        "L1": x1, // A power of L1 is x1
        "L2": x2, // A power of L2 is x2
        ... // Powers of other cabinets
    },
    "CRACSetting": { // Simulated temperature values
        "A1": {
            "switch":1, // Air conditioner A1 is turned on
            "temp":y1   // A temperature of air conditioner A1 is set to
            y1°C
        },
        "A2": {
            "switch":0 // Air conditioner A2 is turned off
        },
        ... // Setting parameters of other air conditioners A3 and A4
    }
}
```

For example, an output result obtained by the simulation device by simulating running of the machine room based on the input parameters may be:

```
SimulationResponse{
    "Cabinet": { // Cabinets
        "L1": {
                "TempIn": y1 // An air inlet temperature of cabinet L1
                is y1
    },
        "L2": {
                "TempIn": y2 // An air inlet temperature of cabinet L2
                is y2
    },
            ... // Air inlet temperatures of other cabinets
        },
    "CRAC": { // Air conditioners
        "A1": {//Air conditioner 1
            "TempIn":x1, // An air inlet temperature of air
            conditioner A1 is x1
            "TempOut":x2 // An air outlet temperature of air
            conditioner A1 is x2
            "Flow":x3 // An air flow of air conditioner A1 is x3, and
            a unit is m^3/s
        },
        "A2":{//Air conditioner 2
            "TempIn":x4,
            "TempOut":x5,
            "Flow":x6
        },
            ... // Air inlet temperatures, air outlet temperatures, and air
flows of other air conditioners A3 and A4
    }
}
```

If cabinet $T_i$>an air inlet temperature upper limit of the cabinet, where the air inlet temperature upper limit of the cabinet is W° C. (for example, 28° C.), a simulated temperature value of a temperature regulating device having a maximum TCI with the cabinet is decreased by a preset value (for example, 1° C.), and then an air inlet temperature of each cabinet is obtained again based on a decreased simulated temperature value. The foregoing process repeats until each cabinet $T_i$≤an air inlet temperature upper limit of the cabinet. A corresponding simulated temperature value of each temperature regulating device is determined as a temperature setting parameter of each temperature regulating device when each cabinet $T_i$≤the air inlet temperature upper limit of the cabinet.

If each cabinet $T_i$≤the air inlet temperature upper limit of the cabinet, the simulated temperature value of each temperature regulating device is determined as the temperature setting parameter of each temperature regulating device.

Step d1: Calculate a power of each temperature regulating device based on the air inlet temperature and the air outlet temperature (which may be obtained from step c1) that are of each temperature regulating device and that correspond to the temperature setting parameter of each temperature regulating device.

For example, a power of a temperature regulating device is:

$$P_{crac}^{j} = \frac{C * M_j * \left(T_j^{in} - T_j^{out}\right)}{cop\left(T_j^{out}\right)} \qquad \text{Formula 1-6}$$

$$cop\left(T_j^{out}\right) = 0.0068 T_j^{out^2} + 0.0008 T_j^{out} + 0.458.$$

C is a specific heat capacity of air, and a value is 1005. There is the calculation formula of a coefficient of performance (coefficient of performance (COP), indicating a cooling capacity that can be obtained in unit power consumption), and 0.0068, 0.0008, and 0.458 that are in the calculation formula are coefficient values obtained through a large quantity of experiments.

$$P_{crac}^{j}$$

indicates a power of the $j^{th}$ air conditioner.

Step e1: Determine a temperature control power of the at least one temperature regulating device based on the power of each temperature regulating device. Specifically, the temperature control power of the at least one temperature regulating device is a sum of powers of all temperature regulating devices.

Step f1: Determine, based on the calculation power of the plurality of cabinets and the temperature control power of the at least one temperature regulating device, the candidate total power corresponding to the candidate server.

The candidate total power corresponding to each candidate server may be determined in a same manner. Then, the energy-saving device may select, from the plurality of candidate servers, the candidate server with the lowest corresponding candidate total power as the target server.

In some other embodiments, a manner in which the energy-saving device determines the target server for the to-be-migrated computing resource based on the cooling capacity conduction relationship information and the computing resource status information may alternatively be: determining an alternate server in each cabinet in the machine room for the to-be-migrated computing resource based on the computing resource status information, where a first power variation is not greater than a second power variation, the first power variation is a power variation that is of the alternate server and that is required if the to-be-migrated computing resource is migrated to the alternate server, and the second power variation is a power variation that is of a server other than the alternate server in a same cabinet and that is required if the to-be-migrated computing resource is migrated to the server other than the alternate server; determining, based on the computing resource status information and the cooling capacity conduction relationship information, a power balance degree corresponding to each cabinet, where the power balance degree is a power balance degree that is of the machine room and that is required if the to-be-migrated computing resource is migrated to the alternate server in each cabinet; and selecting, as the target server, an alternate server in a cabinet with a minimum corresponding power balance degree in the plurality of cabinets.

It can be noted that, the energy-saving device may first select, from the plurality of servers in the machine room, some servers that meet the running requirement of the to-be-migrated computing resource (referring to the descriptions in the foregoing content), and then select the alternate server from the servers. For a manner of calculating a power variation that is of a server and that is required if the to-be-migrated computing resource is migrated to the server, refer to the descriptions in the foregoing content. Details are not described herein again.

Optionally, the method further includes: determining, based on one or more of a quantity of CPU cores of the to-be-migrated computing resource, CPU utilization of the to-be-migrated computing resource, the quantity of CPU cores of the alternate server, or the no load power consumption or the full load power consumption of the alternate server, the power variation that is of the alternate server and that is required if the to-be-migrated computing resource is migrated to the alternate server. The energy-saving device may determine, based on the computing resource status information, one or more of the quantity of CPU cores of the to-be-migrated computing resource, the CPU utilization of the to-be-migrated computing resource, the quantity of CPU cores of the alternate server, or the no load power consumption or the full load power consumption of the alternate server.

In a possible implementation, a normalized power of each cabinet is determined based on cooling capacity conduction relationship information between each cabinet and a home temperature regulating device corresponding to each cabinet and a power that is of each cabinet and that is required if the to-be-migrated computing resource is migrated to the alternate server in each cabinet. The power balance degree corresponding to each cabinet is determined based on the normalized power of each cabinet.

For example, a manner of calculating a power balance degree required when the to-be-migrated computing resource is migrated to server k is described. Server k is a server in cabinet i.

Step a2: Calculate the CPU utilization $S_{cpu-u}$ of each server that is in the machine room.

The CPU utilization of the server is obtained by dividing, by the quantity of CPU cores of the server, the result of the sum of the CPU loads of all the virtual machines on the server plus the sum of the CPU requirements for virtual machine creation tasks on the server. The quantity of CPU cores of the virtual machine multiplied by the CPU utilization of the virtual machine equals the CPU load of the virtual machine. S $$S_{cpu-u}^k$$

indicates CPU utilization of server k.

Step b2: Calculate the power $P_{server}$ of each server that is in the machine room.

If the server includes the virtual machine, $$P_{server}^k = P_{idle}^k + S_{cpu-u}^k * \left(P_{full}^k - P_{idle}^k\right).$$

$$P_{server}^k$$

indicates the power of server k, $$P_{full}^k$$

is the full load power consumption of server k, and $$P_{idle}^k$$

is the no load power consumption of server k. The power of the server is linearly related to the CPU utilization of the server.

If there is no virtual machine on the server, $$P_{server}^k = 0,$$

indicating that the power of server k is 0.

Step c2: Calculate the power $P_{rack}$ of each cabinet that is in the machine room: The cabinet power is equal to the sum of the powers of all the servers in the cabinet.

$$P_{rack}^i$$

indicates the power of the $i^{th}$ cabinet.

Step d2: Calculate the normalized power $\sim P_{rack}$ of each cabinet in the machine room.

For example, for cabinet i, a home temperature regulating device corresponding to the cabinet is determined according to Table 1. For example, the temperature regulating device is temperature regulating device j. A TCI between the $i^{th}$ cabinet and the $j^{th}$ air conditioner is obtained from the TCI table, and is denoted as $tci_{ij}$. Then, a normalized power of cabinet i is $$\sim P_{rack}^i = \frac{P_{rack}^i}{tci_{ij}}.$$

The normalized power $\sim P_{rack}$ of each cabinet in the machine room can be calculated in a same manner.

Step e2: Calculate a standard deviation of normalized powers $$\sim P_{rack}^i$$

of all cabinets in the machine room, and use the standard deviation (which may alternatively be a variance) as a power balance degree corresponding to cabinet i.

In the foregoing similar manner, the power balance degree corresponding to each cabinet that is in the machine room may be determined. Then, the alternate server in the cabinet with the minimum corresponding power balance degree in the plurality of cabinets is selected as the target server. It can be noted that a smaller power balance degree indicates more balanced powers between cabinets in the machine room. In this way, the temperature control power of the temperature regulating device is low. In this manner, the alternate server in each cabinet in the machine room may be selected, and the plurality of alternate servers are the servers with the minimum corresponding power variations. In this way, assuming that the to-be-migrated computing resource is migrated to these servers, the calculation power of the servers is reduced. Further, the alternate server in the cabinet with the minimum power balance degree in the plurality of cabinets is then selected as the target server, so that the temperature control power that is of the temperature regulating device and that is required if the migration is performed may be reduced, so that the total power that is of the machine room and that is required after the migration may be less than the total power that is of the machine room and that is required before the migration.

S13: Generate, as the computing resource adjustment instruction set, an instruction set for migrating the to-be-migrated computing resource to the target server.

In a possible implementation, the method further includes: calculating a power that is of each of the plurality of cabinets and that is required if the computing resource adjustment instruction set is executed; determining a temperature setting parameter of each of the at least one temperature regulating device based on the power of each of the plurality of cabinets, where the temperature setting parameter is for meeting temperature requirements that are of the plurality of cabinets and that are generated after the computing resource adjustment instruction set is executed; and triggering the facility management device to execute a temperature regulation instruction set, where the temperature regulation instruction set is generated based on the temperature setting parameter. The temperature regulation instruction set may include one or more temperature regulating instructions. The temperature regulating instruction may be for regulating a running status (on or off) of the temperature regulating device, or may be for regulating a setting temperature of the temperature regulating device. It can be noted that, for a manner of determining the temperature setting parameter of each temperature regulating device, refer to descriptions of step a1 to step c1 in the foregoing content. In addition, in a specific application process, the determining step may not need to be performed again, and the temperature setting parameter that is of each temperature regulating device and that corresponds to the target server may be selected from a previously determined temperature setting parameter.

For example, the computing resource adjustment instruction set and the temperature regulation instruction set may be:

```
{
    "vmMigrateInstruction": { // Virtual machine migration
instruction set in the computing resource adjustment instruction set
        "vm1": "server4", // Virtual machine 1 is migrated to server4
        "vm3": "server9", // Virtual machine 3 is migrated to server9
        "vm7": "server9", // Virtual machine 7 is migrated to server9
    },
    "taskScheduleInstruction": { // Task schedule instruction set in
the computing resource adjustment instruction set
        "task1": "server14", // Task 1 is scheduled to server14
        "task2": "server7", // Task 2 is scheduled to server7
        "task3": "server9", // Task 3 is scheduled to server9
    },
    "cracSetting": { // Temperature regulation instruction set
        "A1": {// Air conditioner A1 is turned on and the temperature is
        set to 23° C.
            "switch":1,
            "temp": 23
        },
        "A2": { // Air conditioner A2 is turned off
            "switch": 0
        }
    }
}
```

In some other embodiments, the computing resource management instruction set is a computing resource allocation instruction set, and the computing resource allocation instruction set is for allocating the at least one computing resource in the machine room. It may be understood that the at least one computing resource may be a virtual machine or a task. The computing resource allocation instruction set may include one or more allocation instructions for the computing resource. In this embodiment of this application, an increment between total powers that are of the machine room and that are required before and after the computing resource allocation instruction set is executed is minimized. It can be noted that minimizing the increment of the total power of the machine room means that the increment of the total power that is of the machine room and that is required when the computing resource allocation instruction set is executed is less than an increment of the total power that is of the machine room and that is required when another allocation instruction set is executed.

Optionally, a process in which the energy-saving device triggers, based on the cooling capacity conduction relationship information and the computing resource status information, the facility management device to execute the computing resource management instruction set may include the following steps.

S21: Receive a service requirement, where the service requirement is for requesting to run the computing resource in the machine room.

It can be noted that the service requirement may be a service requirement from an outside of the machine room, or may be a service requirement generated by the machine room.

S22: Determine, in the machine room based on the service requirement and the computing resource status information, a target computing resource that meets the service requirement and a target server that provides the target computing resource.

An increment between total powers that are of the machine room and that are required before and after the target server provides the target computing resource is minimized.

In some application scenarios, for a service requirement newly obtained by the machine room, the machine room may allocate the target computing resource for the service requirement in real time, and determine the target server that provides the target computing resource. For example, the service requirement in this scenario may be a computing service. This type of service is generally insensitive to a delay, and has a low requirement on a response speed of the service. For example, the service requirement may be a service requirement of a spark service, a mr (mapreduce) service, a graph computing service, an audio/video encoding/decoding service, or the like. The service requirement may be from a device outside the machine room, or may be from a device inside the machine room.

In some embodiments, a manner of determining, based on the service requirement, the cooling capacity conduction relationship information, and the computing resource status information, the target server for the to-be-migrated computing resource may be: determining, for the target computing resource based on the service requirement, the cooling capacity conduction relationship information, and the computing resource status information, a plurality of candidate servers and a candidate increment corresponding to each candidate server, where the candidate increment is an increment of a total power that is of the machine room and that is required if the target computing resource is migrated to each candidate server; and selecting, from a set of the plurality of candidate servers, a candidate server with a lowest corresponding candidate increment as the target server.

The following describes some methods for determining the candidate server.

In a first possible implementation, to enable the target computing resource to run normally in the target server, it is required that a quantity of CPU cores of the candidate server is not less than a sum of a quantity of CPU cores of the target computing resource and a quantity of CPU cores of an existing computing resource in the candidate server; and/or a memory specification of the candidate server is not less than a sum of a memory specification of the target computing resource and a memory specification of the existing computing resource in the candidate server. In addition, a further requirement may be further imposed on the candidate server based on the service requirement. For example, if the service is an authentication task, the candidate server needs to have an authentication function. It can be noted that some other requirements may be further added to the candidate server. This is not specifically limited in this embodiment of this application. In this implementation, a server that meets a running requirement (or is expressed as "meets the service requirement") of the target computing resource and that is in the machine room may be used as the candidate server.

In a second possible implementation, the energy-saving device may first select, as an alternate server from a plurality of servers in the machine room, a server that meets a running requirement (referring to descriptions of the first possible implementation) of the target computing resource; and then determine, based on the computing resource status information, a power variation corresponding to each alternate server, where the power variation is a power variation that is of each alternate server and that is required if the target computing resource is migrated to each alternate server. An alternate server with a minimum corresponding power variation in each cabinet form the plurality of candidate servers. In this manner, the plurality of candidate servers are servers with minimum corresponding power variations. Therefore, when the target computing resource is allocated to these servers, an increment of the calculation power of the servers is small, so that an increment of a total power that is of the machine room and that is required after the allocation is small.

Optionally, the method further includes: determining, based on one or more of a quantity of CPU cores of the target computing resource, CPU utilization of the target computing resource, a quantity of CPU cores of the alternate server, or no load power consumption or full load power consumption of the alternate server, the power variation that is of the alternate server and that is required if the target computing resource is migrated to the alternate server. For a manner of calculating the power variation corresponding to each alternate server, refer to the descriptions in the foregoing embodiment. Details are not described herein again.

In a third possible implementation, the energy-saving device may first select, as an alternate server from a plurality of servers in the machine room, a server that meets a running requirement (referring to the descriptions of the first possible implementation) of the target computing resource. Then, based on the cooling capacity conduction relationship information and the computing resource status information, a plurality of alternative cabinets that are in the machine room and that have a largest TCI with each temperature regulating device are determined (where for example, in Table 1, a cabinet having a largest TCI with temperature regulating device A1 is cabinet L4), and alternate servers located in the plurality of alternative cabinets are used as the plurality of candidate servers. In this manner, the plurality of candidate servers have the largest TCIs with the temperature regulating device, indicating that cooling capacity absorption capabilities of the candidate servers are stronger. In this way, when the target computing resource is allocated to these servers, an increment of a temperature control power of the temperature regulating device is small, so that the increment of the total power that is of the machine room and that is required after the migration is small.

It can be noted that the target computing resource may include a plurality of computing resources, and one target server may be determined for each target computing resource. Target servers of different target computing resources may be the same or may be different. A computing resource instruction for allocating each target computing resource to the target server corresponding to the target computing resource forms the computing resource allocation instruction set.

Optionally, the target servers may be sequentially determined for the target computing resources in descending order of CPU utilization of the target computing resources. Because the target computing resource with high CPU utilization occupies a high power, in this manner, the target computing resource that has a large impact on the total power of the machine room may be first migrated, so that an increment of the total power of the machine room is small.

In addition, it can be noted that, after a target server corresponding to a target computing resource is determined, running status information of the target server needs to be updated, and the reason is that the target server needs to reserve computing resources for the target computing resource. In other words, in a process of selecting a target server corresponding to a next target computing resource, computing resource status information updated based on a selection result of a previous to-be-selected computing resource is used.

The following describes a manner of determining the candidate increment corresponding to each candidate server. The method may include the following steps.

Step a3: Obtain a first total power that is of the machine room and that is required before assumed allocation of the target computing resource to a candidate server is performed.

Step b3: Obtain a power that is of each of the plurality of cabinets and that is required if the target computing resource is allocated to one candidate server.

Step c3: Determine the calculation power of the plurality of cabinets based on the power of each cabinet. Specifically, the calculation power of the plurality of cabinets is a sum of powers of all the cabinets.

Step d3: Determine a temperature setting parameter of each of the at least one temperature regulating device based on the power of each of the plurality of cabinets, where the temperature setting parameter is for meeting temperature requirements that are of the plurality of cabinets and that are required after the target computing resource is allocated to one candidate server.

Step e3: Calculate a power of each temperature regulating device based on the air inlet temperature and the air outlet temperature (which may be obtained from step d3) that are of each temperature regulating device and that correspond to the temperature setting parameter of each temperature regulating device.

Step f3: Determine a temperature control power of the at least one temperature regulating device based on the power of each temperature regulating device. Specifically, the temperature control power of the at least one temperature regulating device is a sum of powers of all temperature regulating devices.

Step g3: Determine, based on the calculation power of the plurality of cabinets and the temperature control power of the at least one temperature regulating device, a second total power, of a machine room, corresponding to the candidate server, where a candidate increment corresponding to the candidate server is a difference between the second total power and the first total power.

It can be noted that, for an execution manner of step b3 to step g3, refer to an execution manner of step a1 to step f1 described in the foregoing content. The candidate increment corresponding to each candidate server may be determined in a same manner. Then, the candidate server with the lowest corresponding candidate increment is selected, from a set of the plurality of candidate servers, as the target server.

In some other embodiments, a manner in which the energy-saving device determines the target server for the target computing resource based on the cooling capacity conduction relationship information and the computing resource status information may alternatively be: determining an alternate server in each cabinet in the machine room for the target computing resource based on the computing resource status information, where a third power variation is not greater than a fourth power variation, the third power variation is a power variation that is of the alternate server and that is required if the target computing resource is migrated to the alternate server, and the fourth power variation is a power variation that is of a server other than the alternate server in a same cabinet and that is required if the target computing resource is migrated to the server other than the alternate server; determining, based on the computing resource status information and the cooling capacity conduction relationship information, a power balance degree corresponding to each cabinet, where the power balance degree is a power balance degree that is of the machine room and that is required if the target computing resource is migrated to the alternate server in each cabinet; and selecting, as the target server, an alternate server in a cabinet with a minimum corresponding power balance degree in the plurality of cabinets.

It can be noted that, the energy-saving device may first select, from the plurality of servers in the machine room, some servers that meet the running requirement of the target computing resource (referring to the descriptions in the first possible implementation), and then select the alternate server from the servers. For a manner of calculating a power variation that is of a server and that is required if the target computing resource is migrated to the server, refer to the descriptions in the foregoing content. Details are not described herein again.

Optionally, the method further includes: determining, based on one or more of a quantity of CPU cores of the target computing resource, CPU utilization of the target computing resource, the quantity of CPU cores of the alternate server, or the no load power consumption or the full load power consumption of the alternate server, the power variation that is of the alternate server and that is required if the target computing resource is migrated to the alternate server. The energy-saving device may determine, based on the computing resource status information, one or more of the quantity of CPU cores of the target computing resource, the CPU utilization of the target computing resource, the quantity of CPU cores of the alternate server, or the no load power consumption or the full load power consumption of the alternate server.

In a possible implementation, a normalized power of each cabinet is determined based on cooling capacity conduction relationship information between each cabinet and a home temperature regulating device corresponding to each cabinet and a power that is of each cabinet and that is required if the target computing resource is migrated to the alternate server in each cabinet. The power balance degree corresponding to each cabinet is determined based on the normalized power of each cabinet.

It can be noted that, for a manner of calculating a power balance degree required when the target computing resource is migrated to server k, refer to descriptions of the foregoing steps a2 to e2. Details are not described herein again.

In the foregoing similar manner, the power balance degree corresponding to each cabinet that is in the machine room may be determined. Then, the alternate server in the cabinet with the minimum corresponding power balance degree in the plurality of cabinets is selected as the target server. It can be noted that a smaller power balance degree indicates more balanced powers between cabinets in the machine room. In this way, the temperature control power of the temperature regulating device is low. In this manner, the alternate server in each cabinet in the machine room may be selected, and a plurality of alternate servers are servers with minimum corresponding power variations. In this way, assuming that the target computing resource is allocated to these servers, an increment of a calculation power of the servers is small. Further, the alternate server in the cabinet with the minimum power balance degree in the plurality of cabinets is then selected as the target server, so that an increment of the temperature control power that is of the temperature regulating device and that is required if migration is performed may be small, so that an increment of the total power that is of the machine room and that is required after the migration may be small.

S23: Generate, as the computing resource allocation instruction set, an instruction set for allocating the target computing resource by the target server.

In a possible implementation, the method further includes: calculating a power that is of each of the plurality of cabinets and that is required if the computing resource allocation instruction set is executed; determining a temperature setting parameter of each of the at least one temperature regulating device based on the power of each of the plurality of cabinets, where the temperature setting parameter is for meeting temperature requirements that are of the plurality of cabinets and that are required after the computing resource allocation instruction set is executed; and triggering the facility management device to execute a temperature regulation instruction set, where the temperature regulation instruction set is generated based on the temperature setting parameter. It can be noted that, for a manner of determining the temperature setting parameter of each temperature regulating device, refer to descriptions of step a2 to step c2 in the foregoing content. In addition, in a specific application process, the determining step may not need to be performed again, and the temperature setting parameter that is of each temperature regulating device and that corresponds to the target server may be selected from a previously determined temperature setting parameter.

In some other embodiments of this application, considering a large difference between capabilities of cabinets at locations in the machine room to absorb a cooling capacity of the temperature regulating device, the energy-saving device may partition the cabinet and the temperature regulating device that are included in the machine room. One partition includes one temperature regulating device and at least one cabinet. Then, a to-be-selected partition combination with a stronger cooling capacity absorption capability and a stronger cooling capacity sharing capability is determined from partitions. The to-be-migrated computing resource is migrated to a server that is in the to-be-selected partition combination, or the target computing resource is allocated to a server that is in the to-be-selected partition combination. Because the to-be-selected partition combination has a strong cooling capacity absorption capability and cooling capacity sharing capability, in this manner, a temperature control power of the temperature regulating device may be reduced, so that the total power of the machine room is minimized.

In a possible manner, the cabinet and the temperature regulating device that are included in the machine room may be partitioned based on the cooling capacity conduction relationship information of the machine room. For example, the machine room includes a first partition, and the first partition includes a second temperature regulating device and at least one second cabinet; and a capability of each second cabinet to absorb a cooling capacity of the second temperature regulating device is stronger than a capability of each second cabinet to absorb a cooling capacity of a temperature regulating device other than the second temperature regulating device in a plurality of temperature regulating devices. This may be understood as that a partition includes a temperature regulating device and a cabinet with a highest capability to absorb a cooling capacity of the temperature regulating device. A homing relationship between the cabinet and the temperature regulating device described in the foregoing content is used for understanding. One partition includes one temperature regulating device, and a cabinet that uses the temperature regulating device as a home temperature regulating device.

The example shown in Table 1 is used as an example. For a partition manner of the machine room, refer to Table 2.

TABLE 2

| Partition | Temperature regulating device | Cabinets |
| --- | --- | --- |
| P1 | A1 | L1, L2, L3, and L4 |
| P2 | A2 | L5, L6, L7, and L8 |
| P3 | A3 | R1, R2, R3, and R4 |
| P4 | A4 | R5, R6, R7, and R8 |

A value of each unit in the "partition" column is a number of a partition, a value of each unit in the "temperature regulating device" column is a number of a temperature regulating device in a corresponding partition, and values of each unit in the "cabinet" column are numbers of a group of cabinets in a corresponding partition.

Optionally, partition cooling capacity absorption relationship information of a partition and cooling capacity sharing relationship information between two partitions may be determined based on the cooling capacity conduction relationship information. The partition cooling capacity absorption relationship information indicates a capability of a cabinet in each partition in the machine room to absorb a cooling capacity of a temperature regulating device in the partition, and one partition includes one temperature regulating device and at least one cabinet. The cooling capacity sharing relationship information indicates a capability of a cabinet in one partition to share a cooling capacity of a temperature regulating device in the other partition between every two partitions in the machine room.

For example, the machine room includes the first partition, and the first partition includes the second temperature regulating device and the at least one second cabinet. The method in this embodiment of this application further includes: determining partition cooling capacity absorption relationship information of the first partition based on a capability of each of the at least one second cabinet to absorb a cooling capacity of the second temperature regulating device. Specifically, the partition cooling capacity absorption relationship information of the first partition is an association relationship between a cabinet in the first partition, a temperature regulating device in the first partition, and a partition temperature index (partition temperature index, PTI). In this embodiment of this application, the PTI is used to describe a capability of a cabinet in a partition to absorb a cooling capacity of a temperature regulating device that is in the partition. For example, a larger value indicates a stronger capability of a cabinet in a partition to absorb a cooling capacity of a temperature regulating device that is in the partition. A value of the PTI of the first partition is a sum of values of TCIs between cabinets in the first partition and the temperature regulating device that is in the first partition.

Table 1 and Table 2 are used as an example. Partition cooling capacity absorption relationship information of the machine room may be represented as Table 3.

TABLE 3

| Partition | Temperature regulating device | Cabinets | PTI |
| --- | --- | --- | --- |
| P1 | A1 | L1, L2, L3, and L4 | 2.87 |
| P2 | A2 | L5, L6, L7, and L8 | 2.89 |
| P3 | A3 | R1, R2, R3, and R4 | 2.96 |
| P4 | A4 | R5, R6, R7, and R8 | 2.94 |

A value of each unit in the "PTI" column indicates a PTI value of a corresponding partition. Partition P1 is used as an example. A PTI of partition P1 is a sum of TCIs between temperature regulating device A1 and cabinet L1, temperature regulating device A1 and cabinet L2, temperature regulating device A1 and cabinet L3, and temperature regulating device A1 and cabinet L4, that is, $0.64+0.72+0.75+0.76=2.87$.

For example, the machine room further includes a second partition, and the second partition includes a third temperature regulating device and at least one third cabinet. The method in this embodiment of this application further includes: determining cooling capacity sharing relationship information between the first partition and the second partition based on a capability of each of the at least one second cabinet to absorb a cooling capacity of the third temperature regulating device and a capability of each of the at least one third cabinet to absorb a cooling capacity of the second temperature regulating device. Specifically, the cold capacity sharing relationship information between the first partition and the second partition is an association relationship between the first partition, the second partition, and a partition correlation index (partition correlation index, PCI). In this embodiment of this application, the PCI is used to describe a capability of a cabinet in one partition to share a cooling capacity of a temperature regulating device in the other partition between every two partitions. For example, a larger value indicates a stronger capability of a cabinet in a partition to absorb a cooling capacity of a temperature regulating device that is in the other partition. A value of the PCI between the first partition and the second partition is half of a sum of a sum of values of TCIs between cabinets in the first partition and the temperature regulating device that is in the second partition and a sum of values of TCIs between cabinets in the second partition and the temperature regulating device that is in the first partition.

For example, Table 1 and Table 2 are used as an example. A PCI between partition P1 and partition $P3=((0.33+0.28+0.31+0.29)+(0.31+0.24+0.24+0.27))/2=1.13$, where 0.33, 0.28, 0.31, and 0.29 are TCIs between cabinets L1, L2, L3, and L4 in partition P1 and temperature regulating device A3 in partition P3, and 0.31, 0.24, 0.24, and 0.27 are TCIs between cabinets R1, R2, R3, and R4 in partition P3 and temperature regulating device A1 in partition P1. In this way, a PCI between every two partitions in the machine room can be calculated.

Table 1 and Table 2 are used as an example. Cooling capacity sharing relationship information of the machine room may be represented as Table 4.

TABLE 4

| Partition 1 | Partition 2 | PCI |
|---|---|---|
| P1 | P2 | 0.4 |
| P1 | P3 | 1.13 |
| P1 | P4 | 0.29 |
| P2 | P3 | 0.27 |
| P2 | P4 | 1.21 |
| P3 | P4 | 0.35 |

A value of each unit in the "partition 1" column is a number of a first partition in two partitions that share a cooling capacity. A value of each unit in the "partition 2" column is a number of a second partition in the two partitions that share the cooling capacity. A value of each unit in the "PCI" column is a PCI between the first partition and the second partition. For example, the first row in the table of the PCI between partitions indicates that a value of a capability of a cooling capacity shared by partition P1 and partition P2 is 0.4, to be specific, a half of a sum of values of capabilities of all cabinets in partition P1 to absorb a cooling capacity provided by the temperature regulating device in partition P2 and values of capabilities of all cabinets in partition P2 to absorb a cooling capacity provided by the temperature regulating device in partition P1 is 0.4.

In a possible implementation, a to-be-selected partition combination set may be determined based on the partition cooling capacity absorption relationship information and the cooling capacity sharing relationship information. The to-be-selected partition combination set includes a plurality of to-be-selected partition combinations having different partition quantities, where one to-be-selected partition combination is a partition combination having a strongest cooling capacity absorption capability and a strongest cooling capacity sharing capability in one or more partition combinations having a same partition quantity. It can be noted that one partition combination may include one or more partitions. For example, when one partition combination includes one partition, partition combinations may be P1, P2, P3, and P4. When one partition combination includes two partitions, partition combinations may be: a partition combination of P1 and P2, a partition combination of P1 and P3, a partition combination of P1 and P4, a partition combination of P2 and P3, a partition combination of P2 and P4, and a partition combination of P3 and P4. When one partition combination includes three partitions, partition combinations may be a partition combination of P1, P2, and P3, a partition combination of P1, P3, and P4, and a partition combination of P2, P3, and P4. If one partition combination includes four partitions, the partition combination is a partition combination of P1, P2, P3, and P4.

Optionally, a sum, of PTIs and PCIs, corresponding to each of one or more partition combinations having a same partition quantity is calculated. A partition combination corresponding to a largest sum of PTIs and PCIs is used as the to-be-selected partition combination. It can be noted that, when there is only one partition in the partition combination, because the partition combination does not have the cooling capacity sharing capability, PTIs of the partition combinations may be compared.

The foregoing machine room is used as an example. When the partition quantity is 2, a sum of PTIs and a PCI of the partition combination of P2 and P4 is 2.89+2.94+1.21=7.04, and is greater than 6.16 of the partition combination of P1 and P2, 6.1 of the partition combination of P1 and P4, 6.12 of the partition combination of P2 and P3, 6.96 of the partition combination of P1 and P3, and 6.25 of the partition combination of P3 and P4. Therefore, when the partition quantity is 2, the to-be-selected partition combination is the partition combination of P2 and P4.

Table 2, Table 3, and Table 4 are used as an example. The to-be-selected partition combination set of the machine room may be represented as Table 5.

TABLE 5

| Partition quantity | To-be-selected partition combination | Sum of PTIs and PCIs |
|---|---|---|
| 1 | P3 | 2.96 |
| 2 | P2 and P4 | 7.04 |
| 3 | P2, P3, and P4 | 10.62 |
| 4 | P1, P2, P3, and P4 | 15.31 |

A value of each unit in the "partition quantity" column is a partition quantity included in a to-be-selected partition combination. A value of each unit in the "to-be-selected partition combination" column is a to-be-selected partition combination with a corresponding partition quantity. A value of each unit in the "sum of PTIs and PCIs" column is a sum of PTIs in the partitions and PCIs between partitions in a corresponding to-be-selected partition combination. For example, it may be learned from Table 5 that, when the partition quantity is 3, the to-be-selected partition combination is the partition combination of P2, P3, and P4.

Based on the descriptions of this part of content and with reference to the foregoing solution, some other methods for determining a candidate server in this solution may be proposed. The following describes these manners.

In some embodiments, the energy-saving device may determine a plurality of candidate servers and a candidate total power corresponding to each candidate server for the to-be-migrated computing resource based on the cooling capacity conduction relationship information, the to-be-selected partition combination set, and the computing resource status information, where the plurality of candidate servers belong to the to-be-selected partition combination set.

Optionally, a manner in which the energy-saving device may determine the plurality of candidate servers for the to-be-migrated computing resource based on the cooling capacity conduction relationship information, the to-be-selected partition combination set, and the computing resource status information may include the following steps.

S31: Determine, for the to-be-migrated computing resource based on the computing resource status information, an alternate server in each cabinet in each to-be-selected partition combination in the to-be-selected partition combination set.

A first power variation is not greater than a second power variation, the first power variation is a power variation that is of the alternate server and that is required if the to-be-migrated computing resource is migrated to the alternate server, and the second power variation is a power variation that is of a server other than the alternate server in a same cabinet and that is required if the to-be-migrated computing resource is migrated to the server other than the alternate server. It can be noted that, some servers that meet a running requirement of the to-be-migrated computing resource (referring to the descriptions in the foregoing content) may be first selected from servers in each to-be-selected partition combination, and then the alternate server is selected from these servers.

In addition, for a manner of calculating a power variation that is of a server and that is required if the to-be-migrated computing resource is migrated to the server, refer to the descriptions in the foregoing content. Details are not described herein again. In this manner, the alternate server in each cabinet in each to-be-selected partition combination may be selected, and a plurality of alternate servers are servers with minimum corresponding power variations. In this way, assuming that the to-be-migrated computing resource is migrated to these servers, a calculation power of the servers is reduced. Therefore, the total power that is of the machine room and that is required after the migration is less than the total power that is of the machine room and that is required before the migration.

S32: Determine, based on the computing resource status information and the cooling capacity conduction relationship information, a power balance degree corresponding to each cabinet, where the power balance degree is a power balance degree that is of the to-be-selected partition combination to which each cabinet belongs and that is required if the to-be-migrated computing resource is migrated to the alternate server in each cabinet. Optionally, the method further includes: determining, based on one or more of a quantity of CPU cores of the to-be-migrated computing resource, CPU utilization of the to-be-migrated computing resource, a quantity of CPU cores of the alternate server, or no load power consumption or full load power consumption of the alternate server, the power variation that is of the alternate server and that is required if the to-be-migrated computing resource is migrated to the alternate server. The energy-saving device may determine, based on the computing resource status information, one or more of the quantity of CPU cores of the to-be-migrated computing resource, the CPU utilization of the to-be-migrated computing resource, the quantity of CPU cores of the alternate server, or the no load power consumption or the full load power consumption of the alternate server.

In a possible implementation, a normalized power of each cabinet is determined based on cooling capacity conduction relationship information (or may be expressed as cooling capacity conduction relationship information between each cabinet and a home temperature regulating device corresponding to each cabinet) between each cabinet and a temperature regulating device of a partition in which each cabinet is located and a power that is of each cabinet and that is required if the to-be-migrated computing resource is migrated to the alternate server in each cabinet. The power balance degree corresponding to each cabinet is determined based on the normalized power of each cabinet.

For example, a manner of calculating a power balance degree required when the to-be-migrated computing resource is migrated to server k is described. Server k is a server in cabinet i. A to-be-selected partition combination to which the cabinet belongs is to-be-selected partition combination m.

Step a4: Calculate CPU utilization $S_{cpu-u}$ of each server that is in to-be-selected partition combination m.

The CPU utilization of the server is obtained by dividing, by the quantity of CPU cores of the server, the result of the sum of the CPU loads of all the virtual machines on the server plus the sum of the CPU requirements for virtual machine creation tasks on the server. The quantity of CPU cores of the virtual machine multiplied by the CPU utilization of the virtual machine equals the CPU load of the virtual machine.

$$S_{cpu-u}^k$$

indicates CPU utilization of server k.

Step b4: Calculate a power $P_{server}$ of each server that is in to-be-selected partition combination m.

If the server includes the virtual machine, $$P_{server}^k = P_{idle}^k + S_{cpu-u}^k * \left(P_{full}^k - P_{idle}^k\right).$$

$$P_{server}^k$$

indicates a power of server k, $$P_{full}^k$$

is full load power consumption of server k, and $$P_{idle}^k$$

is no load power consumption of server k. A power of a server is linearly related to CPU utilization of a server.

If there is no virtual machine on the server, $$P_{server}^k = 0,$$

indicating that a power of server k is 0.

Step c4: Calculate a power $P_{rack}$ of each cabinet that is in to-be-selected partition combination m: A cabinet power is equal to a sum of powers of all servers in the cabinet.

$$P_{rack}^i$$

indicates a power of an $i^{th}$ cabinet.

Step d4: Calculate a normalized power $\sim P_{rack}$ of each cabinet in to-be-selected partition combination m.

For example, for cabinet i, a temperature regulating device of a partition in which the cabinet is located is obtained according to the table of the PTI in the partition, and a number of the temperature regulating device is denoted as j. A TCI between the $i^{th}$ cabinet and a $j^{th}$ air conditioner is obtained from the TCI table, and is denoted as $tci_{ij}$. In this case, a normalized power $$\sim P^i_{rack} = \frac{P^i_{rack}}{tci_{ij}}$$

of cabinet i is obtained. The normalized power $\sim P_{rack}$ of each cabinet in to-be-selected partition combination m can be calculated in a same manner.

Step e4: Calculate a standard deviation of normalized powers $$\sim P^i_{rack}$$

of all cabinets in to-be-selected partition combination m, and use the standard deviation (which may alternatively be a variance) as a power balance degree corresponding to cabinet i.

In the foregoing similar manner, a power balance degree corresponding to each cabinet in each to-be-selected partition combination may be determined.

S33: Use an alternate server in a cabinet with a minimum corresponding power balance degree in each to-be-selected partition combination to form the plurality of candidate servers.

For example, Table 5 is used as an example. In each of four to-be-selected partition combinations, an alternate server in a cabinet with a minimum corresponding power balance degree may be determined, and four servers form the plurality of candidate servers. It can be noted that, a smaller power balance degree indicates more balanced powers between cabinets in the to-be-selected partition combination. In this way, the temperature control power of the temperature regulating device is low. In addition, because the power variation corresponding to the alternate server is also small, when the to-be-migrated computing resource is migrated to these servers, the calculation power of the servers is reduced, so that the total power that is of the machine room and that is required after the migration is less than the total power that is of the machine room and that is required before the migration.

It can be noted that, after determining the plurality of candidate servers in the foregoing described manner, the energy-saving device may then determine the total candidate power corresponding to each candidate server, and select, from the plurality of candidate servers, a candidate server with a lowest corresponding candidate total power as the target server.

It can be noted that the to-be-migrated computing resource may include a plurality of computing resources, and one target server may be determined for each to-bemigrated computing resource. Target servers of different to-be-migrated computing resources may be the same or may be different. A computing resource instruction for migrating each to-be-migrated computing resource to the target server corresponding to the to-be-migrated computing resource forms the computing resource adjustment instruction set.

In a possible implementation, the method further includes: calculating a power that is of each of the plurality of cabinets and that is required if the computing resource adjustment instruction set is executed; determining a temperature setting parameter of each temperature regulating device based on a power of a cabinet included in a partition in which each temperature regulating device is located; and triggering the facility management device to execute a temperature regulation instruction set, where the temperature regulation instruction set is generated based on the temperature setting parameter. A temperature setting parameter of a temperature regulating device is determined based on a power of a cabinet included in a partition in which the temperature regulating device is located, or this may be expressed as that a temperature regulating device needs to meet a temperature requirement of a cabinet in a partition in which the temperature regulating device is located. With reference to content in the method for determining a temperature setting parameter of each temperature regulating device (step c1) described in the foregoing content, in this implementation, if a case in which a cabinet $T_i$>an air inlet temperature upper limit of the cabinet (where the air inlet temperature upper limit of the cabinet is $W°$ C., for example, 28° C.) exists, a simulated temperature value of a temperature regulating device of a partition in which the cabinet is located may be decreased by a preset value (for example, 1° C.). Then, an air inlet temperature of each cabinet is obtained again based on a decreased simulated temperature value. The foregoing process repeats until each cabinet $T_i$≤an air inlet temperature upper limit of the cabinet. A corresponding simulated temperature value of each temperature regulating device is determined as a temperature setting parameter of each temperature regulating device when each cabinet $T_i$≤the air inlet temperature upper limit of the cabinet.

For example, an example of to-be-selected computing resource adjustment instruction sets (for example, including a virtual machine migration instruction and a task schedule instruction) that are determined based on different to-be-selected partition combinations and that are output by the energy-saving device, and a calculation result that is of a calculation power, a temperature control power, and the temperature setting parameter of each temperature regulating device that are determined based on the to-be-selected computing resource adjustment instruction sets is as follows:

```
{
    "First to-be-selected partition combination": { //Calculation result of a first to-be-
selected partition combination
        "vmMigrateInstruction": {   // Virtual machine migration instructions
            "vm1": "server4", // Virtual machine 1 needs to be migrated to server4
            "vm3": "server9", // Virtual machine 3 needs to be migrated to server9
            "vm7": "server9", // Virtual machine 7 needs to be migrated to server9
        },
        "taskScheduleInstruction": {   // Task schedule instructions
            "task1": "server14", // Task 1 needs to be migrated to server14
            "task2": "server7", // Task 2 needs to be migrated to server7
            "task3": "server9", // Task 3 needs to be migrated to server9
        },
        "cabinetPower": {   // Cabinet powers
            "cabinet1": 80, // A power of cabinet1 is 80 kW
```

-continued

```
            "cabinet2": 100, // A power of cabinet2 is 100 kW
            "cabinet3": 93    // A power of cabinet3 is 93 kW
       },
       "ITPower": 600   // A calculation power is 600 kW
          "cracSetting": {     // Temperature setting parameter of the temperature
regulating device
              "A1": {
                  "switch":1, // Air conditioner A1 is turned on
                  "temp":y1      // A temperature setting parameter of temperature
regulating device A1 is y1° C.
              },
              "A2": {
                  "switch":0 // Air conditioner A2 is turned off
                  ...
              },
       },
          "CoolingPower": 200   // The temperature control power is 200 kW
   },
   },
   "Second to-be-selected partition combination": {
                  ...
   },
       "Third to-be-selected partition combination": {
                  ...
   }
```

Refer to the foregoing output result. A to-be-selected computing resource adjustment instruction set with a lowest corresponding candidate total power may be selected as the computer resource adjustment instruction set, and the temperature regulation instruction set is generated based on a temperature setting parameter that is of each temperature regulating device and that corresponds to the to-be-selected computing resource adjustment instruction set with the lowest corresponding candidate total power.

In some embodiments, the energy-saving device may determine the plurality of candidate servers and the candidate increment corresponding to each candidate server for the target computing resource based on the service requirement, the cooling capacity conduction relationship information, the to-be-selected partition combination set, and the computing resource status information, where the plurality of candidate servers belong to the to-be-selected partition combination set.

Optionally, that the energy-saving device determines the plurality of candidate servers for the target computing resource based on the service requirement, the cooling capacity conduction relationship information, the to-be-selected partition combination set, and the computing resource status information may include the following steps.

S41: Determine, for the target computing resource based on the service requirement and the computing resource status information, an alternate server in each cabinet in each to-be-selected partition combination in the to-be-selected partition combination set.

Some servers that have a capability of providing the target computing resource are first selected from servers in each to-be-selected partition combination, and then the alternate server is selected from these servers.

A third power variation is not greater than a fourth power variation, the third power variation is a power variation that is of the alternate server and that is required if the target computing resource is migrated to the alternate server, and the fourth power variation is a power variation that is of a server other than the alternate server in a same cabinet and that is required if the target computing resource is migrated to the server other than the alternate server.

In addition, for a manner of calculating a power variation that is of a server and that is required if the target computing resource is migrated to the server, refer to the descriptions in the foregoing content. Details are not described herein again. In this manner, the alternate server in each cabinet in each to-be-selected partition combination may be selected, and a plurality of alternate servers are servers with minimum corresponding power variations. In this way, when the target computing resource is migrated to these servers, a calculation power of the servers is reduced. Therefore, the total power that is of the machine room and that is required after the migration is less than the total power that is of the machine room and that is required before the migration.

S42: Determine, based on the computing resource status information and the cooling capacity conduction relationship information, the power balance degree corresponding to each cabinet, where the power balance degree is the power balance degree that is of the to-be-selected partition combination to which each cabinet belongs and that is required if the target computing resource is migrated to the alternate server in each cabinet.

Optionally, the method further includes: determining, based on one or more of a quantity of CPU cores of the target computing resource, CPU utilization of the target computing resource, a quantity of CPU cores of the alternate server, or no load power consumption or full load power consumption of the alternate server, the power variation that is of the alternate server and that is required if the target computing resource is migrated to the alternate server.

In a possible implementation, the normalized power of each cabinet is determined based on the cooling capacity conduction relationship information (or may be expressed as the cooling capacity conduction relationship information between each cabinet and the home temperature regulating device corresponding to each cabinet) between each cabinet and the temperature regulating device of the partition in which each cabinet is located and a power that is of each cabinet and that is required if the target computing resource is migrated to the alternate server in each cabinet. The power balance degree corresponding to each cabinet is determined based on the normalized power of each cabinet.

It can be noted that, for a manner of calculating the power balance degree corresponding to each cabinet, refer to the descriptions in the foregoing step a4 to step e4.

> S43: Use the alternate server in the cabinet with the minimum corresponding power balance degree in each to-be-selected partition combination to form the plurality of candidate servers.

For example, Table 5 is used as an example. In each of four to-be-selected partition combinations, the alternate server in the cabinet with the minimum corresponding power balance degree may be determined, and the four servers form the plurality of candidate servers. It can be noted that, the smaller power balance degree indicates more balanced powers between the cabinets in the to-be-selected partition combination. In this way, the temperature control power of the temperature regulating device is low. In addition, because the power variation corresponding to the alternate server is also small, when the target computing resource is allocated to these servers, an increment of the calculation power of the servers is small, so that an increment between total powers that are of the machine room and that are required before and after allocation is less than an increment between total powers that are of the machine room and that are required before and after another computing resource allocation instruction set is executed.

It can be noted that, after determining the plurality of candidate servers in the foregoing described manner, the energy-saving device may then determine an increment of the total candidate power corresponding to each candidate server, and select, from the plurality of candidate servers, a candidate server with a lowest corresponding candidate total power increment as the target server.

It can be noted that the target computing resource may include a plurality of computing resources, and one target server may be determined for each target computing resource. Target servers of different target computing resources may be the same or may be different. A computing resource instruction for allocating each target computing resource to the target server corresponding to the target computing resource forms the computing resource allocation instruction set.

In a possible implementation, the method further includes: calculating the power that is of each of the plurality of cabinets and that is required if the computing resource allocation instruction set is executed; determining the temperature setting parameter of each temperature regulating device based on the power of the cabinet included in the partition in which each temperature regulating device is located; and triggering the facility management device to execute the temperature regulation instruction set, where the temperature regulation instruction set is generated based on the temperature setting parameter. A temperature setting parameter of a temperature regulating device is determined based on a power of a cabinet included in a partition in which the temperature regulating device is located, or this may be expressed as that a temperature regulating device needs to meet a temperature requirement of a cabinet in a partition in which the temperature regulating device is located. With reference to content in the method for determining a temperature setting parameter of each temperature regulating device (step c1) described in the foregoing content, in this implementation, if the case in which the cabinet $T_i$>an air inlet temperature upper limit of the cabinet (where the air inlet temperature upper limit of the cabinet is W° C., for example, 28° C.) exists, the simulated temperature value of the temperature regulating device of the partition in which the cabinet is located may be decreased by the preset value (for example, 1° C.). Then, the air inlet temperature of each cabinet is obtained again based on the decreased simulated temperature value. The foregoing process repeats until each cabinet $T_i$≤the air inlet temperature upper limit of the cabinet. The corresponding simulated temperature value of each temperature regulating device is determined as the temperature setting parameter of each temperature regulating device when each cabinet $T_i$≤the air inlet temperature upper limit of the cabinet.

To implement functions in the method provided in embodiments of this application, the energy-saving device may include a hardware structure and a software module, and implement the foregoing functions in a form of the hardware structure, the software module, or the hardware structure and the software module One of the foregoing functions may be performed by using the hardware structure, the software module, or the combination of the hardware structure and the software module.

FIG. 6 is a schematic diagram of a structure of an energy-saving device according to an embodiment of this application. The energy-saving device is configured to save power consumption of a machine room. The machine room includes a plurality of cabinets and at least one temperature regulating device. Each cabinet includes at least one server, each server is configured to provide a computing resource, and each temperature regulating device is configured to regulate a temperature of the machine room. The machine room is further provided with a facility management device, the facility management device is configured to manage the computing resource and the temperature regulating device that are of the machine room, and the energy-saving device 60 includes an obtaining unit 601 and a processing unit 602.

The obtaining unit 601 is configured to obtain cooling capacity conduction relationship information of the machine room and computing resource status information of the machine room. Specifically, for an operation performed by the obtaining unit 601, refer to the descriptions of step S101 in the method shown in FIG. 5.

The processing unit 602 is configured to trigger, based on the cooling capacity conduction relationship information and the computing resource status information, the facility management device to execute a computing resource management instruction set, so as to minimize a total power of the machine room while meeting a service requirement. Specifically, for an operation performed by the processing unit 602, refer to the descriptions of step S102 in the method shown in FIG. 5.

The cooling capacity conduction relationship information is for determining a capability of each cabinet in the machine room to absorb a cooling capacity of each temperature regulating device in the machine room, and the computing resource status information is for determining a running location and a running status that are of the computing resource included in the machine room.

In some embodiments, the computing resource management instruction set is a computing resource adjustment instruction set, and the computing resource adjustment instruction set is for adjusting a running location of at least one computing resource in the machine room.

In some embodiments, the processing unit is specifically configured to: determine a to-be-migrated computing resource in the machine room based on the computing resource status information; determine a target server for the to-be-migrated computing resource based on the cooling capacity conduction relationship information and the computing resource status information, where a total power that is of the machine room and that is required after the to-be-migrated computing resource is migrated to the target server is less than a total power that is of the machine room and that is required before the migration; and generate, as the computing resource adjustment instruction set, an instruction set for migrating the to-be-migrated computing resource to the target server.

In some embodiments, the processing unit is specifically configured to: determine, for the to-be-migrated computing resource based on the cooling capacity conduction relationship information and the computing resource status information, a plurality of candidate servers and a candidate total power corresponding to each candidate server, where the candidate total power is a total power that is of the machine room and that is required if the to-be-migrated computing resource is migrated to each candidate server; and select, from the plurality of candidate servers, a candidate server with a lowest corresponding candidate total power as the target server.

In some embodiments, the processing unit is further configured to: obtain a power that is of each of the plurality of cabinets and that is required if the computing resource adjustment instruction set is executed; determine a temperature setting parameter of each of the at least one temperature regulating device based on the power of each of the plurality of cabinets, where the temperature setting parameter is for meeting temperature requirements that are of the plurality of cabinets and that are generated after the computing resource adjustment instruction set is executed; and trigger the facility management device to execute a temperature regulation instruction set, where the temperature regulation instruction set is generated based on the temperature setting parameter.

In some embodiments, the computing resource management instruction set is a computing resource allocation instruction set, and the computing resource allocation instruction set is for allocating at least one computing resource in the machine room.

In some embodiments, the processing unit is specifically configured to: receive a service requirement, where the service requirement is for requesting to run the computing resource in the machine room; determine, based on the service requirement, the cooling capacity conduction relationship information, and the computing resource status information, a target computing resource that meets the service requirement and a target server that provides the target computing resource, where an increment between total powers that are of the machine room and that are required before and after the target server provides the target computing resource is minimized; and generate, as the computing resource allocation instruction set, an instruction set for allocating the target computing resource by the target server.

In some embodiments, the processing unit is specifically configured to: determine, for the target computing resource based on the service requirement, the cooling capacity conduction relationship information, and the computing resource status information, a plurality of candidate servers and a candidate increment corresponding to each candidate server, where the candidate increment is an increment of a total power that is of the machine room and that is required if the target computing resource is migrated to each candidate server; and select, from a set of the plurality of candidate servers, a candidate server with a lowest corresponding candidate increment as the target server.

In some embodiments, the processing unit is further configured to: obtain a power that is of each of the plurality of cabinets and that is required if the computing resource allocation instruction set is executed; determine a temperature setting parameter of each of the at least one temperature regulating device based on the power of each of the plurality of cabinets, where the temperature setting parameter is for meeting temperature requirements that are of the plurality of cabinets and that are required after the computing resource allocation instruction set is executed; and trigger the facility management device to execute a temperature regulation instruction set, where the temperature regulation instruction set is generated based on the temperature setting parameter.

It can be noted that operations performed by the units of the energy-saving device shown in FIG. 6 may be the related content in the foregoing method embodiments. Details are not described herein again. The foregoing units may be implemented by hardware, software, or a combination of software and hardware. For technical effects that can be achieved in each implementation, refer to the descriptions in the foregoing content. In an embodiment, functions of the obtaining unit 601 and the processing unit 602 in the foregoing content may be implemented by one or more processors in the energy-saving device 60.

The energy-saving device shown in FIG. 6 may trigger, based on the cooling capacity conduction relationship information and the computing resource status information, the facility management device to execute a computing resource management instruction set, so as to minimize a total power of the machine room while meeting a service requirement.

Figure 7:
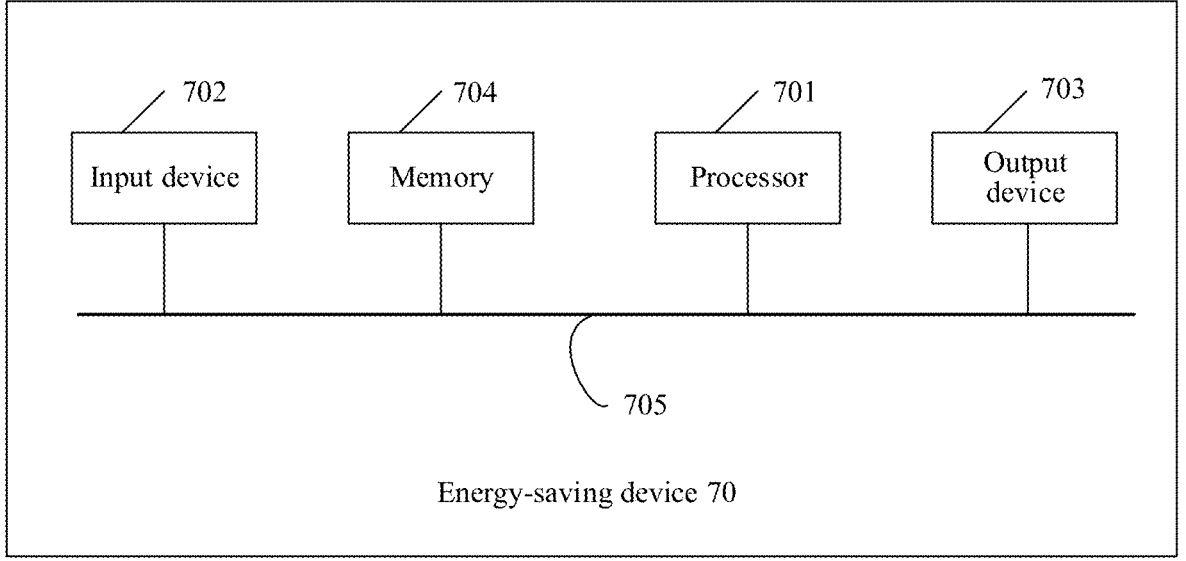
FIG. 7 is a schematic diagram of a structure of another energy-saving device according to an embodiment of this application.

FIG. 7 is a schematic diagram of a structure of another energy-saving device according to an embodiment of this application. The energy-saving device 70 is configured to save power consumption of a machine room. The machine room includes a plurality of cabinets and at least one temperature regulating device. Each cabinet includes at least one server, each server is configured to provide a computing resource, and each temperature regulating device is configured to regulate a temperature of the machine room. The machine room is further provided with a facility management device. The facility management device is configured to manage the computing resource and the temperature regulating device that are in the machine room. The energy-saving device 70 may include one or more processors 701, one or more input devices 702, one or more output devices 703, and a memory 704. The processor 701, the input device 702, the output device 703, and the memory 704 are connected via a bus 705. The memory 704 is configured to store instructions.

The processor 701 may be a central processing unit, or the processor may be another general-purpose processor, a digital signal processor, an application-specific integrated circuit, another programmable logic device, or the like. The general-purpose processor may be a microprocessor, or the processor may be any conventional processor or the like.

The input device 702 may include a communication interface, a data cable, and the like, and the output device 703 may include a display (such as an LCD), a data cable, a communication interface, and the like.

The memory 704 may include a read-only memory and a random access memory, and provide instructions and data for the processor 701. A part of the memory 704 may further include a non-volatile random access memory. For example, the memory 704 may further store information about a device type.

The processor 701 is configured to run the instructions stored in the memory 704 to perform the following operations:

obtaining cooling capacity conduction relationship information of the machine room and computing resource status information of the machine room; and triggering, based on the cooling capacity conduction relationship information and the computing resource status information, the facility management device to execute a computing resource management instruction set, so as to minimize a total power of the machine room while meeting a service requirement.

The cooling capacity conduction relationship information is for determining a capability of each cabinet in the machine room to absorb a cooling capacity of each temperature regulating device in the machine room, and the computing resource status information is for determining a running location and a running status that are of the computing resource included in the machine room.

For the operations performed by the processor 701, refer to related content in the foregoing method embodiment. Details are not described herein again.

The energy-saving device shown in FIG. 7 may trigger, based on the cooling capacity conduction relationship information and the computing resource status information, the facility management device to execute a computing resource management instruction set, so as to minimize the total power of the machine room while meeting the service requirement.

A person skilled in the art may further understand that various illustrative logical blocks (illustrative logic blocks) and steps (steps) that are listed in embodiments of this application may be implemented by using electronic hardware, computer software, or a combination thereof. Whether the functions are implemented by using hardware or software depends on particular applications and a design requirement of an entire system. A person skilled in the art may use various methods to implement the described functions for each particular application, but it does not need to be considered that the implementation goes beyond the scope of embodiments of this application.

This application further provides a computer-readable storage medium storing a computer program. When the computer-readable storage medium is executed by a computer, functions in any method embodiment are implemented.

This application further provides a computer program product. When the computer program product is executed by a computer, functions in any method embodiment are implemented.

An embodiment of this application further provides a computing resource supply system. The computing resource supply system may include the energy-saving device and the machine room in the embodiment corresponding to FIG. 5. For the energy-saving device and the machine room, refer to the descriptions of any one of the foregoing method embodiments.

All or some of the foregoing embodiments may be implemented through software, hardware, firmware, or any combination thereof. When the software is used to implement embodiments, all or some of embodiments may be implemented in a form of a computer program product. The computer program product includes one or more computer instructions. When the computer instructions are loaded and executed on the computer, the procedure or functions according to embodiments of this application are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another web site, computer, server, or data center in a wired (for example, a coaxial cable, an optical fiber, or a digital subscriber line (digital subscriber line, DSL)) or wireless (for example, infrared, radio, or microwave) manner. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a high-density digital video disc (digital video disc, DVD)), a semiconductor medium (for example, a solid-state drive (solid-state drive, SSD)), or the like.

A person of ordinary skill in the art may understand that various numerals such as "first" and "second" in this application are merely used for differentiation for ease of description, and are not used to limit the scope or a sequence of embodiments of this application.

The correspondences shown in the tables in this application may be configured, or may be predefined. Values of the information in the tables are merely examples, and other values may be configured. This is not limited in this application. When a correspondence between the information and the parameters is configured, not all the correspondences shown in the tables need to be configured. For example, in the tables in this application, correspondences shown in some rows may alternatively not be configured. For another example, proper deformations and adjustments such as splitting and combination may be performed based on the foregoing tables. Names of the parameters shown in titles of the foregoing tables may alternatively be other names that can be understood by a communication apparatus, and values or representation manners of the parameters may alternatively be other values or representation manners that can be understood by the communication apparatus. During implementation of the foregoing tables, another data structure, such as an array, a queue, a container, a stack, a linear table, a pointer, a linked list, a tree, a graph, a structure, a class, a pile, a hash list, or a hash table, may alternatively be used.

"Predefine" in this application may be understood as "define", "define in advance", "store", "pre-store", "pre-negotiate", "pre-configure", "solidify", or "pre-burn".

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it does not need to be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiment. Details are not described herein again.

The foregoing descriptions are merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An energy-saving method applied to a machine room, wherein the machine room comprises a plurality of cabinets and at least one temperature regulating device, each cabinet comprises at least one server, each server is configured to provide a computing resource, and each temperature regulating device is configured to regulate a temperature of the machine room; the machine room is further provided with a facility management device, and the facility management device is configured to manage the computing resource and the temperature regulating device that are of the machine room; and the method comprises:

obtaining cooling capacity conduction relationship information of the machine room and computing resource status information of the machine room, wherein between each cabinet of the plurality of cabinets and each temperature regulating device of the at least one temperature regulating device, the cooling capacity conduction relationship information of the machine room includes a value indicating a capability of the cabinet to absorb a cooling capacity of the temperature regulating device; and triggering, based on the cooling capacity conduction relationship information and the computing resource status information, the facility management device to execute a computing resource management instruction set to minimize a total power of the machine room while meeting a service requirement, wherein the cooling capacity conduction relationship information is for determining a capability of each cabinet in the machine room to absorb a cooling capacity of each temperature regulating device in the machine room, and the computing resource status information is for determining a running location and a running status that are of the computing resource comprised in the machine room.

2. The method according to claim 1, wherein the computing resource management instruction set is a computing resource adjustment instruction set, and the computing resource adjustment instruction set is for adjusting a running location of at least one computing resource in the machine room.

3. The method according to claim 2, wherein the triggering, based on the cooling capacity conduction relationship information and the computing resource status information, the facility management device to execute a computing resource management instruction set comprises:

determining a to-be-migrated computing resource in the machine room based on the computing resource status information;

determining a target server for the to-be-migrated computing resource based on the cooling capacity conduction relationship information and the computing resource status information, wherein a total power that is of the machine room and that is required after the to-be-migrated computing resource is migrated to the target server is less than a total power that is of the machine room and that is required before the to-be-migrated computing resource is migrated to the target server; and generating, as the computing resource adjustment instruction set, an instruction set for migrating the to-be-migrated computing resource to the target server.

4. The method according to claim 3, wherein the determining a target server for the to-be-migrated computing resource based on the cooling capacity conduction relationship information and the computing resource status information comprises:

determining, for the to-be-migrated computing resource based on the cooling capacity conduction relationship information and the computing resource status information, a plurality of candidate servers and a candidate total power corresponding to each candidate server, wherein the candidate total power is a total power that is of the machine room and that is required if the to-be-migrated computing resource is migrated to each candidate server; and selecting, from the plurality of candidate servers, a candidate server with a lowest corresponding candidate total power as the target server.

5. The method according to claim 4, wherein the determining, for the to-be-migrated computing resource based on the cooling capacity conduction relationship information and the computing resource status information, a plurality of candidate servers and a candidate total power corresponding to each candidate server comprises:

determining partition cooling capacity absorption relationship information and cooling capacity sharing relationship information based on the cooling capacity conduction relationship information;

determining a to-be-selected partition combination set based on the partition cooling capacity absorption relationship information and the cooling capacity sharing relationship information; and determining the plurality of candidate servers and the candidate total power corresponding to each candidate server for the to-be-migrated computing resource based on the cooling capacity conduction relationship information, the to-be-selected partition combination set, and the computing resource status information, wherein the plurality of candidate servers belong to the to-be-selected partition combination set, and wherein:

the partition cooling capacity absorption relationship information indicates a capability of a cabinet in each partition in the machine room to absorb a cooling capacity of a temperature regulating device in the partition, and one partition comprises one temperature regulating device and at least one cabinet;

the cooling capacity sharing relationship information indicates a capability of a cabinet in one partition to share a cooling capacity of a temperature regulating device in the other partition between every two partitions in the machine room; and the to-be-selected partition combination set comprises a plurality of to-be-selected partition combinations having different partition quantities, wherein one to-be-selected partition combination is a partition combination having a strongest cooling capacity absorption capability and a strongest cooling capacity sharing capability in one or more partition combinations having a same partition quantity.

6. The method according to claim 5, wherein the determining the plurality of candidate servers for the to-be-migrated computing resource based on the cooling capacity conduction relationship information, the to-be-selected partition combination set, and the computing resource status information comprises:

determining, for the to-be-migrated computing resource based on the computing resource status information, an alternate server in each cabinet in each to-be-selected partition combination in the to-be-selected partition combination set, wherein a first power variation is not greater than a second power variation, the first power variation is a power variation that is of the alternate server and that is required if the to-be-migrated computing resource is migrated to the alternate server, and the second power variation is a power variation that is of a server other than the alternate server in a same cabinet and that is required if the to-be-migrated computing resource is migrated to the server other than the alternate server;

determining, based on the computing resource status information and the cooling capacity conduction relationship information, a power balance degree corresponding to each cabinet, wherein the power balance degree is a power balance degree that is of the to-be-selected partition combination to which each cabinet belongs and that is required if the to-be-migrated computing resource is migrated to the alternate server in each cabinet; and using an alternate server in a cabinet with a minimum corresponding power balance degree in each to-be-selected partition combination to form the plurality of candidate servers.

7. The method according to claim 5, wherein the method further comprises:

calculating a power that is of each of the plurality of cabinets and that is required if the computing resource adjustment instruction set is executed;

determining a temperature setting parameter of each temperature regulating device based on a power of a cabinet comprised in a partition in which each temperature regulating device is located; and triggering the facility management device to execute a temperature regulation instruction set, wherein the temperature regulation instruction set is generated based on the temperature setting parameter.

8. The method according to claim 5, wherein the machine room comprises a first partition, the first partition comprises a second temperature regulating device and at least one second cabinet, and the method further comprises:

determining partition cooling capacity absorption relationship information of the first partition based on a capability of each of the at least one second cabinet to absorb a cooling capacity of the second temperature regulating device.

9. The method according to claim 5, wherein the machine room comprises a first partition and a second partition, the first partition comprises a second temperature regulating device and at least one second cabinet, and the second partition comprises a third temperature regulating device and at least one third cabinet; and the method further comprises:

determining cooling capacity sharing relationship information between the first partition and the second partition based on a capability of each of the at least one second cabinet to absorb a cooling capacity of the third temperature regulating device and a capability of each of the at least one third cabinet to absorb a cooling capacity of the second temperature regulating device.

10. The method according to claim 5, wherein:

the machine room comprises a first partition, and the first partition comprises a second temperature regulating device and at least one second cabinet; and a capability of each second cabinet to absorb a cooling capacity of the second temperature regulating device is stronger than a capability of each second cabinet to absorb a cooling capacity of a temperature regulating device other than the second temperature regulating device in the at least one temperature regulating device.

11. The method according to claim 3, wherein the determining a target server for the to-be-migrated computing resource based on the cooling capacity conduction relationship information and the computing resource status information comprises:

determining an alternate server in each cabinet in the machine room for the to-be-migrated computing resource based on the computing resource status information, wherein a first power variation is not greater than a second power variation, the first power variation is a power variation that is of the alternate server and that is required if the to-be-migrated computing resource is migrated to the alternate server, and the second power variation is a power variation that is of a server other than the alternate server in a same cabinet and that is required if the to-be-migrated computing resource is migrated to the server other than the alternate server;

determining, based on the computing resource status information and the cooling capacity conduction relationship information, a power balance degree corresponding to each cabinet, wherein the power balance degree is a power balance degree that is of the machine room and that is required if the to-be-migrated computing resource is migrated to the alternate server in each cabinet; and selecting, as the target server, an alternate server in a cabinet with a minimum corresponding power balance degree in the plurality of cabinets.

12. The method according to claim 3, wherein the total power of the machine room comprises a calculation power of the plurality of cabinets and a temperature control power of the at least one temperature regulating device.

13. The method according to claim 2, wherein the method further comprises:

calculating a power that is of each of the plurality of cabinets and that is required if the computing resource adjustment instruction set is executed;

determining a temperature setting parameter of each of the at least one temperature regulating device based on the power of each of the plurality of cabinets, wherein the temperature setting parameter is for meeting temperature requirements that are of the plurality of cabinets and that are generated after the computing resource adjustment instruction set is executed; and triggering the facility management device to execute a temperature regulation instruction set, wherein the temperature regulation instruction set is generated based on the temperature setting parameter.

14. The method according to claim 1, wherein the computing resource management instruction set is a computing resource allocation instruction set, and the computing resource allocation instruction set is for allocating at least one computing resource in the machine room.

15. The method according to claim 14, wherein the triggering, based on the cooling capacity conduction relationship information and the computing resource status information, the facility management device to execute a computing resource management instruction set comprises:

receiving a service requirement, wherein the service requirement is for requesting to run the computing resource in the machine room;

determining, based on the service requirement, the cooling capacity conduction relationship information, and the computing resource status information, a target computing resource that meets the service requirement and a target server that provides the target computing resource, wherein an increment between total powers that are of the machine room and that are required before and after the target server provides the target computing resource is minimized; and generating, as the computing resource allocation instruction set, an instruction set for allocating the target computing resource by the target server.

16. The method according to claim 15, wherein the determining, based on the service requirement, the cooling capacity conduction relationship information, and the computing resource status information, a target computing resource that meets the service requirement and a target server that provides the target computing resource comprises:

determining, for the target computing resource based on the service requirement, the cooling capacity conduction relationship information, and the computing resource status information, a plurality of candidate servers and a candidate increment corresponding to each candidate server, wherein the candidate increment is an increment of a total power that is of the machine room and that is required if the target computing resource is migrated to each candidate server; and selecting, from the plurality of candidate servers, a candidate server with a lowest corresponding candidate increment as the target server.

17. The method according to claim 15, wherein the triggering, based on the cooling capacity conduction relationship information and the computing resource status information, the facility management device to execute a computing resource management instruction set comprises:

determining, for the target computing resource based on the computing resource status information, an alternate server in each cabinet in the machine room, wherein the alternate server has a capability of providing the target computing resource, and a third power variation is not greater than a fourth power variation, wherein the third power variation is a power variation that is of the alternate server and that is required if the target computing resource is migrated to the alternate server, and the fourth power variation is a power variation that is of a server other than the alternate server in a same cabinet and that is required if the target computing resource is migrated to the server other than the alternate server;

determining, based on the computing resource status information and the cooling capacity conduction relationship information, a power balance degree corresponding to each cabinet, wherein the power balance degree is a power balance degree that is of the machine room and that is required if the target computing resource is migrated to the alternate server in each cabinet; and selecting, as the target server, an alternate server in a cabinet with a minimum corresponding power balance degree in the plurality of cabinets.

18. The method according to claim 17, wherein the method further comprises:

calculating a power that is of each of the plurality of cabinets and that is required if the computing resource allocation instruction set is executed;

determining a temperature setting parameter of each temperature regulating device based on a power of a cabinet comprised in a partition in which each temperature regulating device is located; and triggering the facility management device to execute a temperature regulation instruction set, wherein the temperature regulation instruction set is generated based on the temperature setting parameter.

19. The method according to claim 15, wherein the method further comprises:

calculating a power that is of each of the plurality of cabinets and that is required if the computing resource allocation instruction set is executed;

determining a temperature setting parameter of each of the at least one temperature regulating device based on the power of each of the plurality of cabinets, wherein the temperature setting parameter is for meeting temperature requirements that are of the plurality of cabinets and that are required after the computing resource allocation instruction set is executed; and triggering the facility management device to execute a temperature regulation instruction set, wherein the temperature regulation instruction set is generated based on the temperature setting parameter.

20. The method according to claim 1, wherein a first cabinet is comprised in the plurality of cabinets, a first temperature regulating device is comprised in the at least one temperature regulating device, and the method further comprises:

determining cooling capacity conduction relationship information between the first cabinet and the first temperature regulating device based on a first temperature, a second temperature, a first air inlet temperature, and a second air inlet temperature, wherein;

the first air inlet temperature is an air inlet temperature that is of the first cabinet and that is obtained by simulating running of the machine room based on a first setting model, the first setting model is constructed based on the machine room, and the first setting model comprises the plurality of cabinets of a first power and the at least one temperature regulating device of the first temperature; and the second air inlet temperature is an air inlet temperature that is of the first cabinet and that is obtained by simulating running of the machine room based on a second setting model, the second setting model is constructed based on the machine room, and the second setting model comprises the plurality of cabinets of the first power, the first temperature regulating device of the second temperature, and a temperature regulating device other than the first temperature regulating device in the at least one temperature regulating device of the first temperature.

* * * * *